United States Patent
Ikeda et al.

(10) Patent No.: US 11,510,002 B2
(45) Date of Patent: Nov. 22, 2022

(54) SEMICONDUCTOR DEVICE

(71) Applicant: Semiconductor Energy Laboratory Co., Ltd., Atsugi (JP)

(72) Inventors: Takayuki Ikeda, Atsugi (JP); Kiyotaka Kimura, Isehara (JP); Takeya Hirose, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/260,686

(22) PCT Filed: Aug. 23, 2019

(86) PCT No.: PCT/IB2019/057096
§ 371 (c)(1),
(2) Date: Jan. 15, 2021

(87) PCT Pub. No.: WO2020/044183
PCT Pub. Date: Mar. 5, 2020

(65) Prior Publication Data
US 2021/0297775 A1    Sep. 23, 2021

(30) Foreign Application Priority Data
Aug. 31, 2018   (JP) .............................. JP2018-162358

(51) Int. Cl.
*H04R 3/00*    (2006.01)
*H01L 27/105*  (2006.01)
(Continued)

(52) U.S. Cl.
CPC ......... *H04R 3/005* (2013.01); *H01L 27/1052* (2013.01); *H01L 27/124* (2013.01);
(Continued)

(58) Field of Classification Search
CPC ..... H04R 3/005; H04R 1/406; H01L 27/1052; H01L 27/1207; H01L 27/1225;
(Continued)

(56) References Cited

U.S. PATENT DOCUMENTS 6,525,993 B2   2/2003  Wake et al.
7,816,680 B2  10/2010  Kim et al.
(Continued)

FOREIGN PATENT DOCUMENTS

CN    102067319 A    5/2011
CN    103069717 A    4/2013
(Continued)

OTHER PUBLICATIONS

International Search Report (Application No. PCT/IB2019/057096) dated Oct. 15, 2019.
(Continued)

*Primary Examiner* — William A Jerez Lora
(74) *Attorney, Agent, or Firm* — Robinson Intellectual Property Law Office; Eric J. Robinson

(57) ABSTRACT

A semiconductor device with a novel structure which can identify the sound source is provided. The semiconductor device includes a microphone array, delay circuits, and a signal processing circuit. The delay circuit includes a first selection circuit, which selects a microphone, signal retention circuits, which retain voltages depending on the sound signal, and a second selection circuit, which selects a signal retention circuit. Each signal retention circuit includes a transistor which includes a semiconductor layer including an oxide semiconductor in its channel formation region. The first selection circuit writes the voltage of discreet sound signals to the signal retention circuit. The second selection circuit selects at different timings the voltages which are
(Continued)

retained in the signal retention circuit and generates the output signal corresponding to the delayed sound signal.

8 Claims, 14 Drawing Sheets

(51) Int. Cl.
*H01L 27/12* (2006.01)
*H01L 29/786* (2006.01)
*H04R 1/40* (2006.01)

(52) U.S. Cl.
CPC ...... *H01L 27/1207* (2013.01); *H01L 27/1225* (2013.01); *H01L 27/1255* (2013.01); *H01L 29/7869* (2013.01); *H01L 29/78648* (2013.01); *H04R 1/406* (2013.01)

(58) Field of Classification Search
CPC ............... H01L 27/124; H01L 27/1255; H01L 29/78648; H01L 29/7869
USPC ........................ 381/56, 58, 91, 92, 122, 124
See application file for complete search history.

(56) References Cited

U.S. PATENT DOCUMENTS

| | | | |
|---|---|---|---|
| 9,831,878 B2 | 11/2017 | Nagatomo | |
| 11,177,792 B2 | 11/2021 | Koyama | |
| 2001/0019516 A1 | 9/2001 | Wake et al. | |
| 2009/0294764 A1 | 12/2009 | Kim et al. | |
| 2012/0057396 A1* | 3/2012 | Yamazaki | G11C 5/025 365/149 |
| 2014/0185846 A1 | 7/2014 | Gran et al. | |
| 2014/0185847 A1 | 7/2014 | Gran et al. | |
| 2015/0280691 A1 | 10/2015 | Koyama | |
| 2020/0228912 A1* | 7/2020 | Mate | H04S 7/303 |
| 2021/0328580 A1 | 10/2021 | Koyama | |

FOREIGN PATENT DOCUMENTS

| | | |
|---|---|---|
| CN | 107017874 A | 8/2017 |
| EP | 2302685 A | 3/2011 |
| JP | 11-142499 A | 5/1999 |
| JP | 2001-236092 A | 8/2001 |
| JP | 2011-525041 | 9/2011 |
| WO | WO-2012/017843 | 2/2012 |

OTHER PUBLICATIONS

Written Opinion (Application No. PCT/IB2019/057096) dated Oct. 15, 2019.
Chinese Office Action (Application No. 201980055430.4) dated Mar. 3, 2022.

\* cited by examiner

SEMICONDUCTOR DEVICE

TECHNICAL FIELD

One embodiment of the present invention relates to a semiconductor device.

In this specification and the like, a semiconductor device generally means a device that can function by utilizing semiconductor characteristics. In some cases, it can be said that a display device (e.g., a liquid crystal display device and a light-emitting display device), a projection device, a lighting device, an electro-optical device, a power storage device, a memory device, a semiconductor circuit, an imaging device, a sound-separation device, a sound-source identification device, a sensor device, and the like include a semiconductor device.

BACKGROUND ART

There is a technique which is called sound-source identification; the technique is for identifying the direction from which a specific sound comes. Sound-source identification is expected to be used for a sound sensor for a robot or hearing aids (e.g., Patent document 1 and Patent document 2).

In the sound-source identification, a plurality of microphones are arranged in an array to estimate the sound-source location. For example, in a delay-and-sum microphone array, delay is added to sound which enters microphones so that the sound from the targeted direction is in phase, whereby the targeted direction is focused. Sound signals captured by microphones are processed by processing circuits such as A/D (Analog to Digital) converter circuits.

REFERENCE

Patent Document

[Patent Document 1] Specification of United States Patent Application Publication No. 2014/0185846
[Patent Document 2] Specification of United States Patent Application Publication No. 2014/0185847

SUMMARY OF THE INVENTION

Problems to be Solved by the Invention

When the number of microphones is increased for the sake of angular resolution, processing time for sound signals also increases exponentially. In addition, when an A/D converter circuit and the like are provided individually to each microphone, plenty of arithmetic processing is required as digital signals are delayed in arithmetic processing, which causes a problem such as a decrease in angular resolution due to frequency differences or unsynchronization in signal processing.

An object of one embodiment of the present invention is to provide a semiconductor device with a novel structure that can collectively process signals from a plurality of microphones as analog signals. Another object of one embodiment of the present invention is to provide a semiconductor device with a novel structure that can reduce malfunctions due to frequency differences or unsynchronization, which is caused by plenty of arithmetic processing or the like. Another object of one embodiment of the present invention is to provide a novel semiconductor device and the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a semiconductor device including a microphone array including a first microphone and a second microphone, a first selection circuit selecting one of the first microphone and the second microphone, a first signal retention circuit obtaining a plurality of first sound signals from the first microphone at different timings and retaining a plurality of first voltages depending on the plurality of first sound signals, a second signal retention circuit obtaining a plurality of second sound signals from the second microphone at different timings and retaining a plurality of second voltages depending on the plurality of the second sound signals, a second selection circuit selecting any one of the plurality of first voltages and any one of the plurality of second voltages, and a signal processing circuit to which the first voltage and the second voltage which are selected by the second selection circuit. The first signal retention circuit and the second signal retention circuit each include a first transistor. The first transistor includes a semiconductor layer including an oxide semiconductor in a channel formation region. The second selection circuit has a function of selecting the plurality of first voltages and the plurality of second voltages at different timings and generating a signal in which any one of the plurality of first sound signals and the plurality of second sound signals is delayed.

In one embodiment of the semiconductor device of the present invention, the first transistor preferably functions as a selection switch in the first selection circuit.

In one embodiment of the semiconductor device of the present invention, the first signal retention circuit and the second signal retention circuit each preferably include an amplifying circuit including a second transistor, and the second transistor preferably includes a semiconductor layer including an oxide semiconductor in a channel formation region.

In one embodiment of the semiconductor device of the present invention, the second selection circuit preferably includes a third transistor, and the third transistor preferably includes a semiconductor layer including an oxide semiconductor in a channel formation region.

In one embodiment of the semiconductor device of the present invention, the signal processing circuit preferably includes a differential circuit, an integrator circuit, a comparator, and a triangle-wave-generator circuit. The first voltage and the second voltage are preferably input to the differential circuit. An output signal from the differential circuit is preferably input to the integrator circuit. An output signal from the integrator circuit and an output signal from the triangle-wave-generator circuit are preferably input to the comparator.

In one embodiment of the semiconductor device of the present invention, the differential circuit preferably includes a fourth transistor, and the fourth transistor preferably includes a semiconductor layer including an oxide semiconductor in a channel formation region.

Note that other embodiments of the present invention are shown in the description of the following embodiments and the drawings.

Effect of the Invention

One embodiment of the present invention can provide a semiconductor device with a novel structure that can collectively process signals from a plurality of microphones as analog signals. One embodiment of the present invention can provide a semiconductor device with a novel structure that can reduce malfunctions due to frequency differences and unsynchronization, which is caused by plenty of arithmetic processing or the like. One embodiment of the present invention can provide a novel semiconductor device and the like.

Note that the descriptions of the effects do not disturb the existence of other effects. In one embodiment of the present invention, there is no need to achieve all these effects. Effects other than these are apparent from the description of the specification, the drawings, the claims, and the like, and effects other than these can be derived from the description of the specification, the drawings, the claims, and the like.

MODE FOR CARRYING OUT THE INVENTION

Figure 1A:
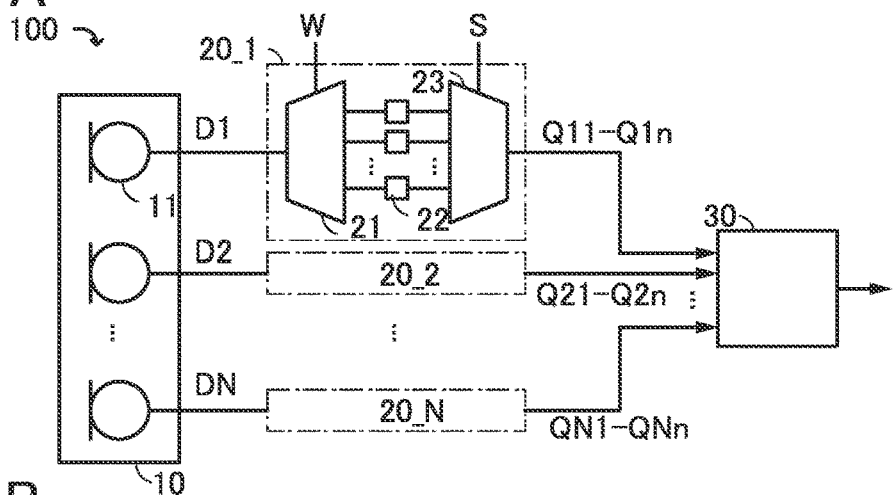
FIG. 1A and FIG. 1B are diagrams showing a structure of a semiconductor device.

Embodiments are described below with reference to the drawings. Note that the embodiments can be implemented with many different modes, and it is readily appreciated by those skilled in the art that modes and details can be changed in various ways without departing from the spirit and scope of the present invention. Thus, the present invention should not be interpreted as being limited to the following description of the embodiments.

Note that ordinal numbers such as "first", "second", and "third" in this specification and the like are used in order to avoid confusion among components. Thus, the terms do not limit the number of components. In addition, the terms do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

Note that in the drawings, the same elements, elements having similar functions, elements formed of the same material, elements formed at the same time, or the like are sometimes denoted by the same reference numerals, and repeated description thereof is omitted in some cases.

Embodiment 1

The structure and operation of a semiconductor device of one embodiment of the present invention are described with reference to FIG. 1 to FIG. 9. The semiconductor device of one embodiment of the present invention includes a microphone array having a plurality of microphones, and has a function as a sound-source identification device by adding delay to the sound which enters each microphone so that the sound from a targeted direction is in phase, whereby the targeted direction is focused. The differences of the distance between a sound source and each microphone lead to the time-of-flight (ToF) differences of sound waves, which allows the sound-source location to be estimated.

A semiconductor device 100 shown in FIG. 1A includes a microphone array 10, delay circuits 20_1 to 20_N (N is a natural number of 2 or more), and a signal processing circuit 30.

When one of the delay circuits 20_1 to 20_N needs to be specified, the delay circuit is described with a reference numeral 20; when a specific delay circuit is focused, the delay circuit is described with a reference numeral such as 20_1 or 20_2. The same can be applied to other components, and a reference numeral such as "_2" or [1] is used to distinguish a plurality of components.

The microphone array 10 includes a plurality of microphones 11. The microphones 11 have a function capable of converting captured sound waves into electric signals (referred to as source signals). Sound signals converted by each microphone 11 are shown as sound signals D1 to DN.

The delay circuits 20_1 to 20_N are provided to every microphone 11. The sound signals D1 to DN are provided to every delay circuit 20_1 to 20N. The delay circuits 20_1 to 20_N have a function of generating output signals, which are obtained by delaying sound signals given by each microphone 11. The delay circuits 20_1 to 20_N each have a selection circuit 21, a plurality of signal retention circuits 22, and a selection circuit 23.

The selection circuit 21 (also referred to as a first selection circuit) has a function of a demultiplexer, which splits one of the sound signals D1 to DN, such as the sound signal D1, into the plurality of signal retention circuits 22. The selection circuit 21 has a function of a switch, whose on or off is controlled by a selection signal W. The selection circuit 21 is composed of re-channel transistors, for example. An H level selection signal W turns on the transistors included in the selection circuit 21, and an L level selection signal W turns off the transistors included in the selection circuit 21.

The plurality of signal retention circuits 22 has a function of retaining analog voltages corresponding to the sound signals and outputting voltages depending on the analog voltages. An analog voltage is written to the signal retention circuit 22 by turning the switch of the selection circuit 21 on at a predetermined timing and sampling sound signals. Writing an analog voltage to the signal retention circuit 22 can be controlled by turning the selection signal W to the H level. Retaining an analog voltage in the signal retention circuit 22 can be controlled by turning the selection signal W to the L level.

To each of the plurality of signal retention circuits 22 are written analog voltages, which are based on the sound signals at the time when the selection signals W are turned to the H level at different timings, and the analog voltages are retained by turning the selection signals W to the L level. The plurality of signal retention circuits 22 can obtain the sound signals from the microphones 11 at different timings and retain voltages depending on the sound signals. The plurality of signal retention circuits 22 consecutively sample the sound signals, whereby discrete values of the sound signals output from the microphones 11 can be retained.

The plurality of signal retention circuits 22 also has a function of amplifying and outputting the retained analog voltages. For example, the plurality of signal retention circuits 22 each include a source-follower circuit, and have a function of outputting voltages depending on the retained analog voltages through the source-follower circuit or the like.

The selection circuit 23 (also referred to as a second selection circuit) has a function of a multiplexer, which selects one of the analog voltages retained in the plurality of signal retention circuits 22 and outputs it at a different timing. The selection circuit 23 has a function of a switch, whose on or off is controlled by a selection signal S. The selection circuit 23 is composed of n-channel transistors, for example. The H level selection signal S turns on the transistors included in the selection circuits 23, and the L level selection signal S turns off the transistors included in the selection circuits 23.

The selection circuit 23 is provided to each of the delay circuits 20_1 to 20_N, and output signals Q11-Q1n to QN1-QNn can be obtained. The output signals Q11-Q1n are signals corresponding to the sound signal D1, which are discrete signals obtained by consecutively outputting the analog voltages retained in the plurality of signal retention circuits 22 included in the delay circuit 20_1. This output signals Q11-Q1n correspond to the sound signal D1 delayed by a certain period. The output signals Q21-Q2n to QN1-QNn are also signals corresponding to the sound signals D2 to DN, which are discrete signals obtained by consecutively outputting the analog voltages retained in the signal retention circuits 22 included in the delay circuits 20_2 to 20_N. This output signals Q21-Q2n to QN1-QNn correspond to the sound signals D2 to DN delayed by a certain period. In the selection circuit 23, a certain delay time is set for the selection signal S, whereby the output signals Q11-Q1n to QN1-QNn, which correspond to sound signals with a determined delay time, can be output.

Each transistor included in the delay circuit 20 is particularly preferably a transistor whose channel formation region includes an oxide semiconductor (hereinafter referred to as an OS transistor). The OS transistor has an extremely low leakage current (hereinafter off-state current), which flows between the source and the drain at the off state; thus, when the OS transistor is used as transistors included in the delay circuit 20 in one embodiment of the present invention, analog voltages obtained by sampling sound signals can be retained in the signal retention circuits 22 in the delay circuit 20. This enables a structure which can precisely obtain analog voltages, whereby sound-source estimation using sound signals can be precisely performed.

The signal retention circuit 22 using OS transistors can rewrite and read out analog voltages by charging and discharging charges, thereby obtaining and reading out analog voltages substantially without limit. A signal retention circuit including OS transistors is superior in rewrite endurance because, unlike a magnetic memory or a resistive random-access memory, it does not go through atomic-level structure change. In addition, unstableness due to the increase of electron trap centers is not observed in a signal retention circuit including OS transistors even when rewrite operation is repeated like in a flash memory.

The signal retention circuit using OS transistors can be freely arranged on a circuit using transistors including silicon in the channel formation region (hereinafter Si transistor); integration can be easily performed even when a plurality of delay circuits are provided. In addition, since an OS transistor can be fabricated using manufacturing equipment similar to that of an Si transistor, the fabrication is possible at low costs.

Moreover, an OS transistor can be a four-terminal semiconductor element including a back gate electrode in addition to a gate electrode, a source electrode, and a drain electrode. An electric network where input/output of signals flowing between a source and a drain can be independently controlled in accordance with a voltage applied to the gate electrode or the back gate electrode can be constituted. Thus, circuit design with the same ideas as those of an LSI is possible. In addition, an OS transistor has electric characteristics superior to those of an Si transistor under high-temperature environments. Specifically, an OS transistor is capable of good switching operation under high temperatures within the range of 125° C. to 150° C., since its on-state current/off-state current ratio is high.

The signal processing circuit 30 has a function of calculating the difference between the output signals, which are selected by the selection circuits 23, and calculating integral values of the difference, and estimating the delay time at which sound signals are in phase. The signal processing circuit 30 includes, for example, a differential circuit, an integrator circuit, a comparator, and a triangle-wave-generator circuit. To the differential circuit are input two output-signal voltages which are selected by the selection circuit 23 to be compared. The integrator circuit outputs a value obtained by integrating output signals from the differential circuit. To the comparator are input output signals from the integrator circuit and the triangle-wave-generator circuit. The signal processing circuit 30 compares and processes signals of analog values, which removes a large-area circuit such as an A/D converter circuit and suppresses increase in the circuit area.

The semiconductor device 100 in FIG. 1A includes OS transistors as transistors included in the delay circuits 20, and uses the mode of retaining charges corresponding to analog voltages sampled at different timings. Since the OS transistors have an extremely small off-state current, the once retained analog voltages can be retained even in a small-capacity node; thus, a plurality of delay circuits can be provided. The semiconductor device 100 in FIG. 1A uses the mode in which analog voltages corresponding to charges retained in the delay circuits 20 are read out at different timings so that discrete sound signals are read out as output signals. With different timings of control signals S, a desired delay time can be obtained. This removes conversion of sound signals to digital signals to obtain a desired delay time, so that discrete sound signals in phase can be achieved.

Figure 1B:
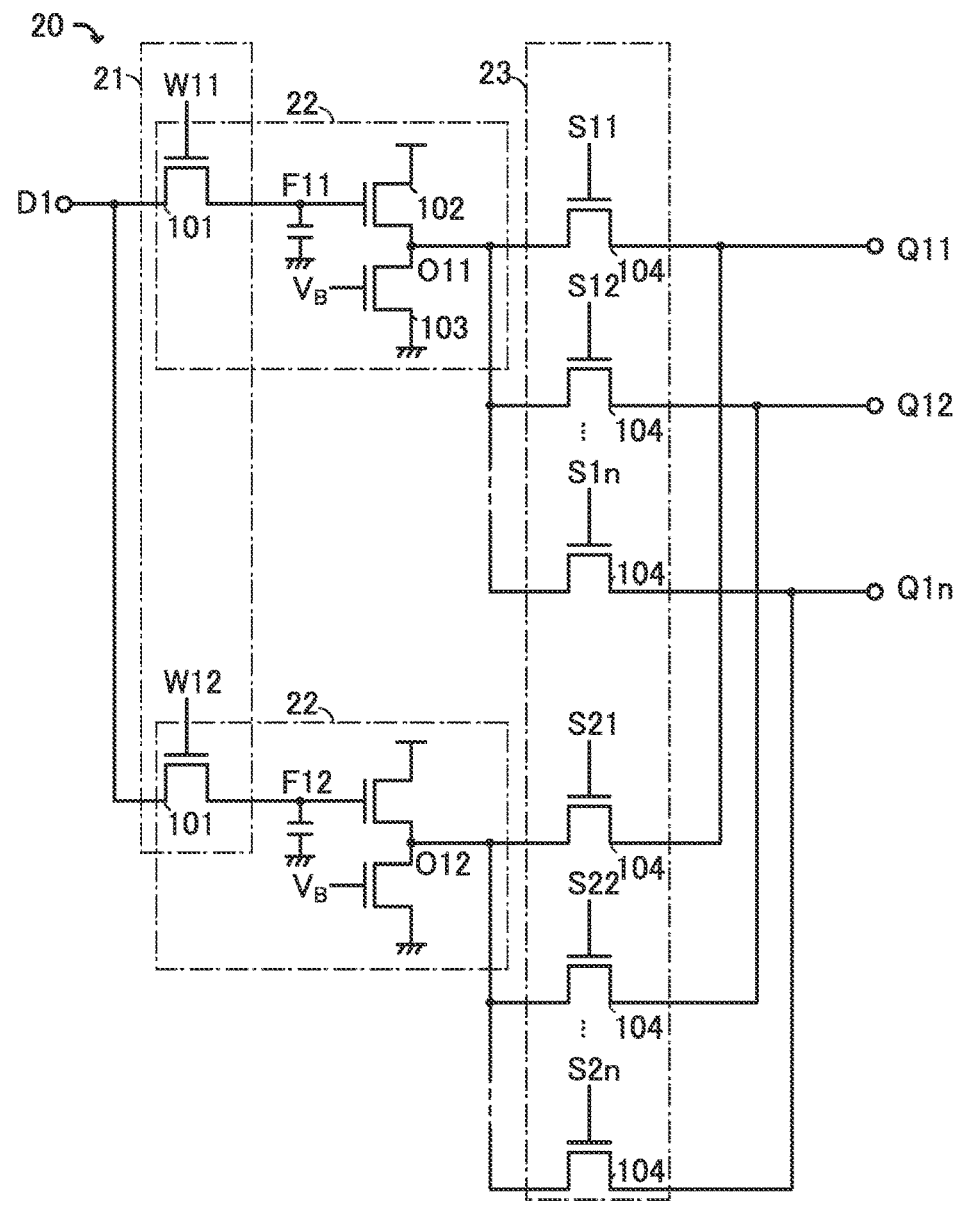

FIG. 1B shows a specific circuit structure example of the delay circuit 20 shown in FIG. 1A. FIG. 1B is a structure example of a delay circuit in which the sound signal D1, which is output from the microphone 11, is held at two nodes and output as three output signals with different delay times.

FIG. 1B shows a transistor 101 which is included in the selection circuit 21, the transistor 101, a transistor 102, and a transistor 103 which are included in the signal retention circuit 22, and transistors 104, which are included in the selection circuit 23. The transistors 101 to 104 are n-channel transistors, and function as switches that are turned on by the H level control signal and turned off by the L level control signal.

FIG. 1B shows selection signals W11 and W12 as the selection signal W. The selection signals W11 and W12 are signals for sampling analog voltages of the sound signal D1 at different timings.

FIG. 1B shows nodes F11 and F12, which are for retaining the analog voltages sampled by the selection circuit 21. In FIG. 1B, the nodes F11 and F12 are connected to the gates of the transistors 102, which are input terminals of the source-follower circuit. It is shown that bias voltages $V_B$ of the source-follower circuit are applied to the gates of the transistors 102. It is shown that the nodes F11 and F12 are connected to capacitors; the capacitors can be omitted when the gate capacitance of the transistor 102 is sufficiently large. Nodes connected to the transistor 102 and the transistor 103, which are included in the source-follower circuit, are shown as O11 and O12 in FIG. 1B. The voltages of the nodes O11 and O12 correspond to the analog voltages of the nodes F11 and F12. The source-follower circuit can improve charge-providing ability to the following selection circuit 23.

FIG. 1B shows selection signals S11 to S1$n$ and S21 to S2$n$ as the selection signal S in the selection circuit 23. The selection signals S11 to S1$n$ and S21 to S2$n$ select the voltages of the nodes O11 and O12, which correspond to the sampled analog voltages, and output signals Q11 to Q1$n$, which correspond to the sound signals D1 delayed by a certain time.

Next, the operation of the delay circuit 20 shown in FIG. 1B is described with reference to FIG. 2 to FIG. 4.

Figure 2A:
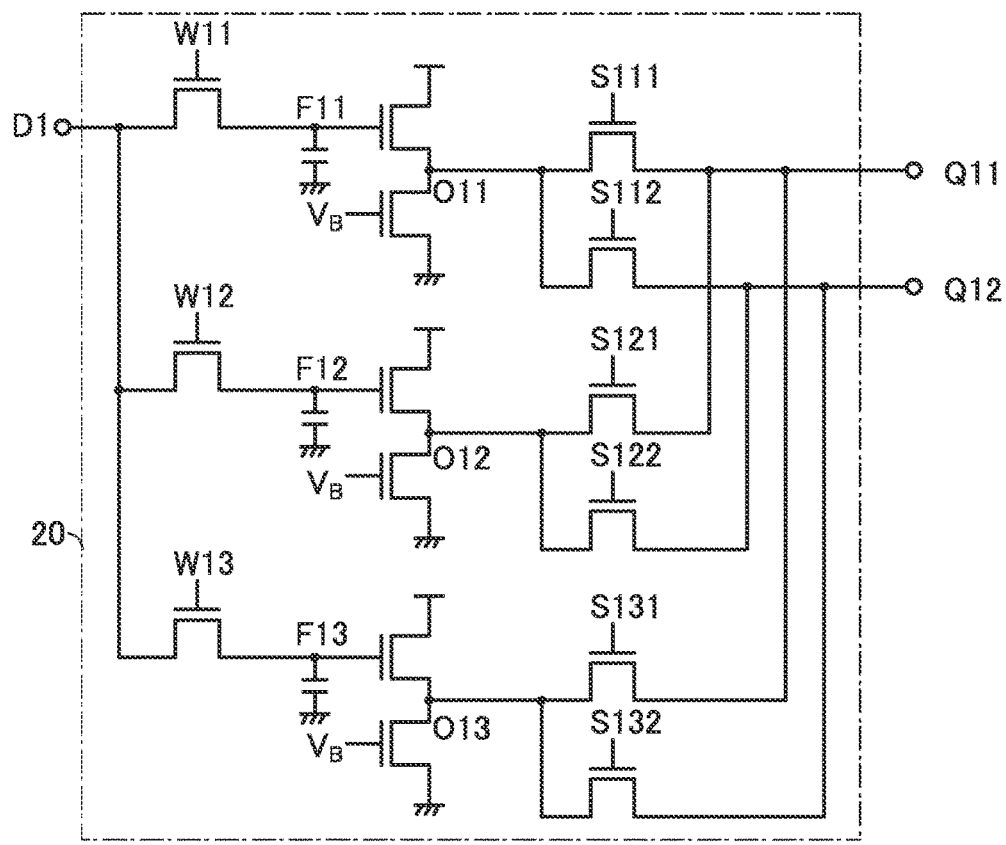
FIG. 2A and FIG. 2B are diagrams showing a structure of a semiconductor device.

FIG. 2A is a structure example of the delay circuit 20; to facilitate the understanding of the operation in FIG. 1B, the selection signal W for sampling the sound signals is selection signals W11 to W13, and the selection signal S for reading out a retained plurality of analog voltages as the output signal Q11 and the output signal Q12 is selection signals S111, S112, S121, S122, S131, and S132. The delay circuit 20 in FIG. 2A has a structure which samples sound signals at three different timings to obtain three analog voltages and outputs two output signals with different delay times at two different timings. FIG. 2A also shows the node F11 to a node F13, and the node O11 to a node O13.

Figure 2B:
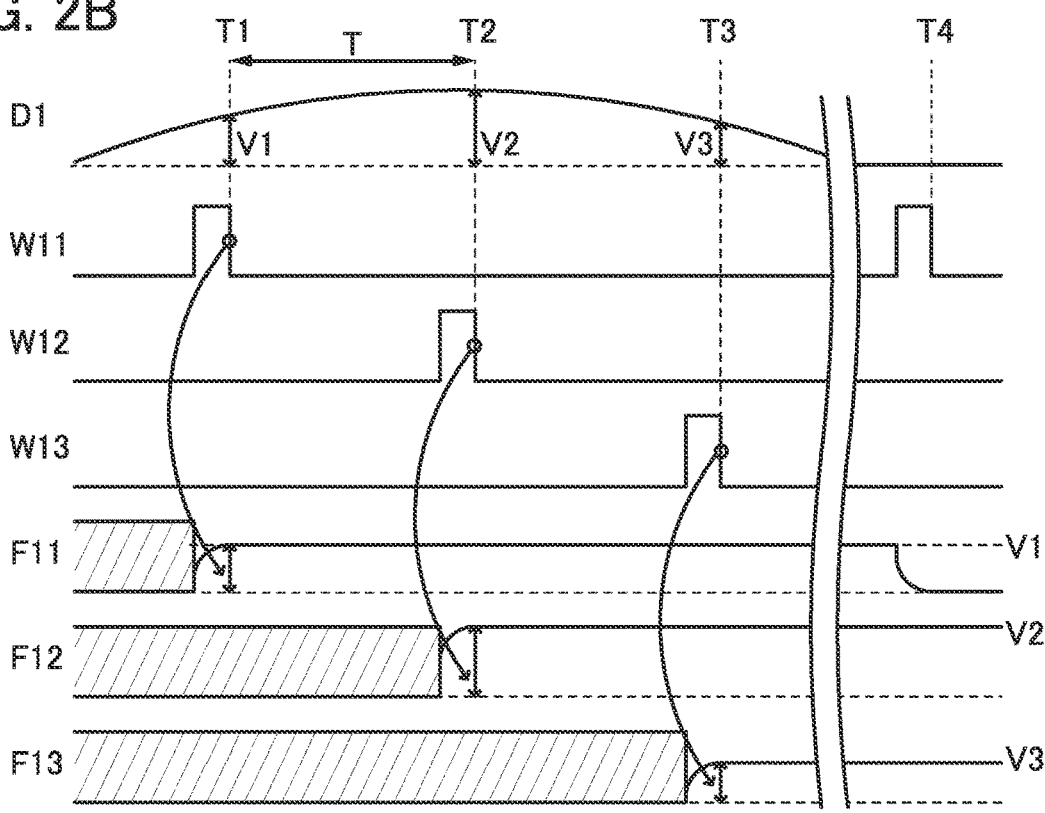

FIG. 2B is a timing chart showing a sampling operation for the sound signal D1, which is connected to the delay circuit 20 in FIG. 2A. FIG. 2B shows at times T1 to T4 a wave of the sound signal D1, and the operation of the selection signals W11 to W13 and voltages written to the nodes F11 to F13. In the diagram showing the timing chart, the periods with hatching are periods in unstable state.

To sample the sound signal D1, the selection signal W11 is set to the H level at the time T1 and a voltage V1 of the sound signal D1 is written to the node F11, as described above.

At the time T2, which is a period T later, the selection signal W12 is set to the H level and a voltage V2 of the sound signal D1 is written to the node F12 to sample the sound signal D1. The period T is preferably short. This increases the number of samplings of the sound signal and improves the angular resolution of the sound signal.

At the time T2, the selection signal W13 is set to the H level and a voltage V3 of the sound signal D1 is written to the node F13 to sample the sound signal D1.

The voltages V1 to V3 retained at the nodes F11 to F13 can be retained by setting the selection signals W11 to W13 to the L level. To initialize them, the sound signal at a constant potential is given and the selection signal W11 is set to the H level as shown in a time T4.

Figure 3:
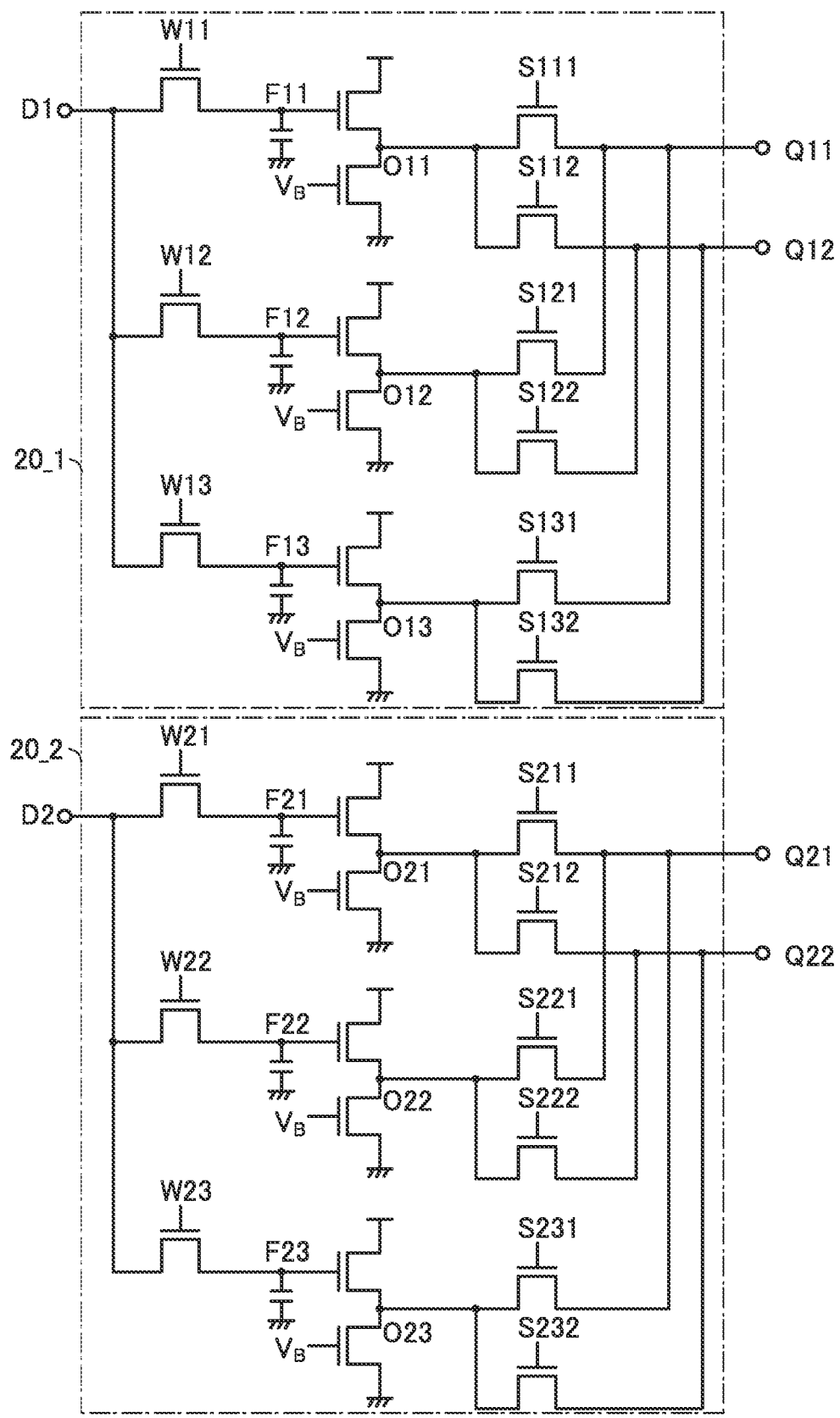
FIG. 3 is a diagram showing an operation of a semiconductor device.

FIG. 3 is a structure example of a delay circuit 20_1; to facilitate the understanding of the circuit operation in FIG. 1B, the selection signal W for sampling the sound signal D1 is the selection signals W11 to W13, and the selection signal S for reading out retained voltages as the output signals Q11 and Q12 is the selection signals S111, S112, S121, S122, S131, and S132. FIG. 3 is also a structure example of a delay circuit 20_2; to facilitate the understanding of the circuit operation in FIG. 1B, the selection signal W for sampling the sound signal D2 is the selection signals W21 to W23, and the selection signal S for reading out retained voltages as the output signals Q21 and Q22 is the selection signals S211, S212, S221, S222, S231, and S232. The delay circuits 20_1 and 20_2 in FIG. 3 have a structure which obtains three analog voltages and outputs two output signals with different delay times at two different timings. FIG. 3 also shows the nodes F11 to F13, nodes F21 to F23, the nodes O11 to O13, and nodes O21 to O23.

Figure 4:
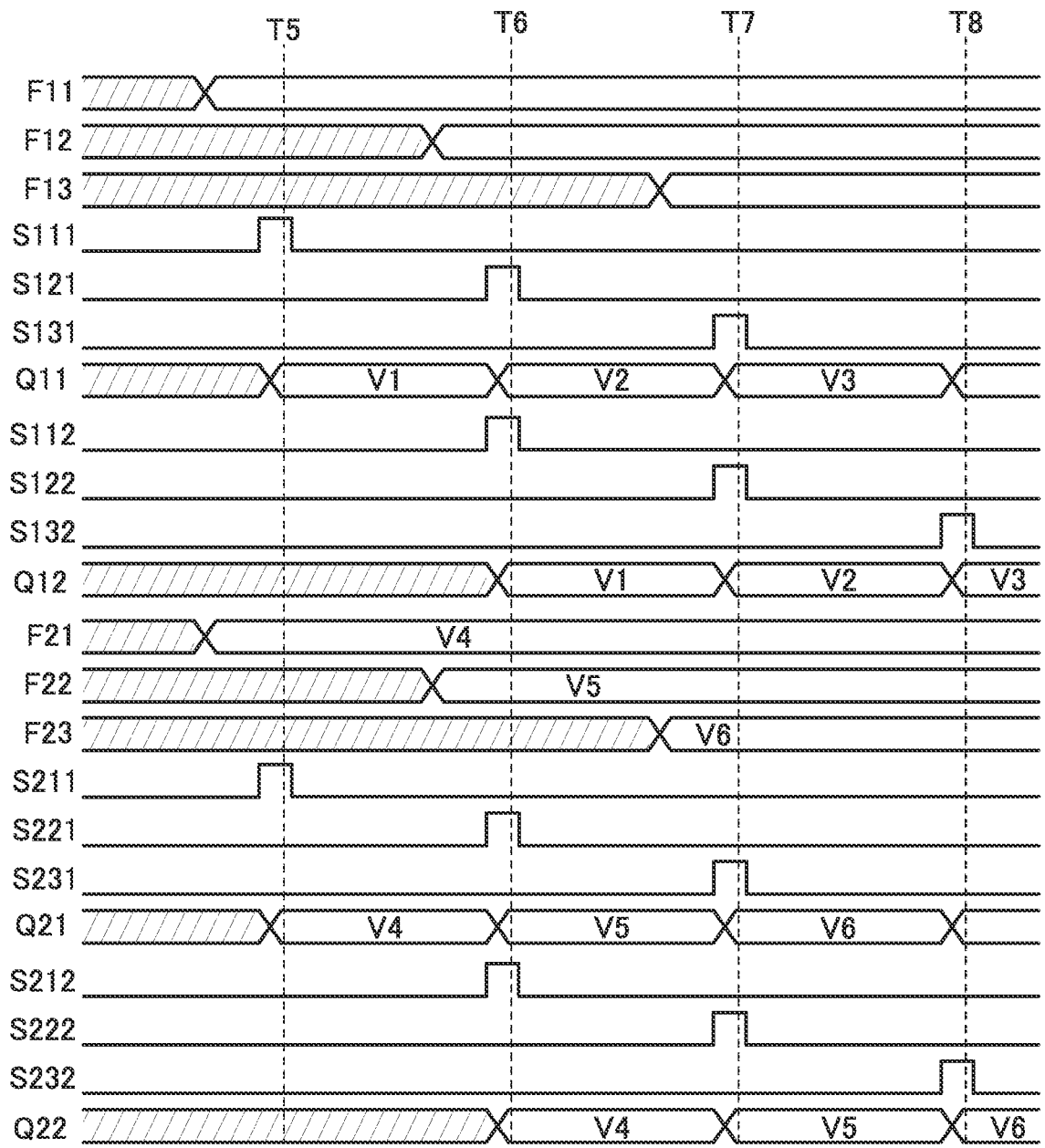
FIG. 4 is a diagram showing an operation of a semiconductor device.

FIG. 4 is a timing chart showing the operations of reading out the voltages V1 to V3, which are retained at the nodes F11 to F13 respectively in the delay circuit 20_1 in FIG. 3, and the voltages V4 to V6, which are retained at the nodes F21 to F23 in the delay circuit 20_2 in FIG. 3, as the output signals Q11, Q12, Q21, and Q22. FIG. 4 shows at times T5 to T8 the operations in which the output signals Q11 and Q12 are read out from the nodes F11 to F13 by the selection signals S111, S112, S121, S122, S131, and S132, and the output signals Q21 and Q22 are read out from the nodes F21 to F23 by the selection signals S211, S212, S221, S222, S231, and S232.

At the time T5, the selection signal S111 is set to the H level, and the voltage corresponding to the voltage V1 at the node F11 is output as the output signal Q11. At the same time T5, the selection signal S211 is set to the H level, and the voltage corresponding to the voltage V4 at the node F21 is output as the output signal Q21.

At the time T6, the selection signal S121 is set to the H level, and the voltage corresponding to the voltage V2 at the node F12 is output as the output signal Q11. At the same time T6, the selection signal S112 is set to the H level, and the voltage corresponding to the voltage V4 at the node F11 is output as the output signal Q12. At the same time T6, the selection signal S221 is set to the H level, and the voltage corresponding to the voltage V5 at the node F22 is output as the output signal Q21. At the same time T6, the selection signal S212 is set to the H level, and the voltage corresponding to the voltage V4 at the node F21 is output as the output signal Q22.

At the time T7, the selection signal S131 is set to the H level, and the voltage corresponding to the voltage V3 at the node F13 is output as the output signal Q11. At the same time T7, the selection signal S122 is set to the H level, and the voltage corresponding to the voltage V5 at the node F12 is output as the output signal Q12. At the same time T7, the selection signal S231 is set to the H level, and the voltage corresponding to the voltage V6 at the node F23 is output as the output signal Q21. At the same time T7, the selection signal S222 is set to the H level, and the voltage corresponding to the voltage V5 at the node F22 is output as the output signal Q22.

At the time T8, the selection signal S132 is set to the H level, and the voltage corresponding to the voltage V3 at the node F13 is output as the output signal Q12. At the same time T8, the selection signal S232 is set to the H level, and the voltage corresponding to the voltage V6 at the node F23 is output as the output signal Q22.

The output signal Q12 can be obtained as the delayed output signal Q11 as shown in FIG. 4. Similarly, the output signal Q22 can be obtained as the delayed output signal Q21. By controlling the timing of the selection signal S, the signals retained in the signal retention circuits can be output with any delay time. When the distance between the sound source and the microphones is different between the delay circuit 20_1 and the delay circuit 20_2, for example, the sound signals can be in phase by changing the delay time, whereby the sound source direction can be estimated.

Figure 5A:
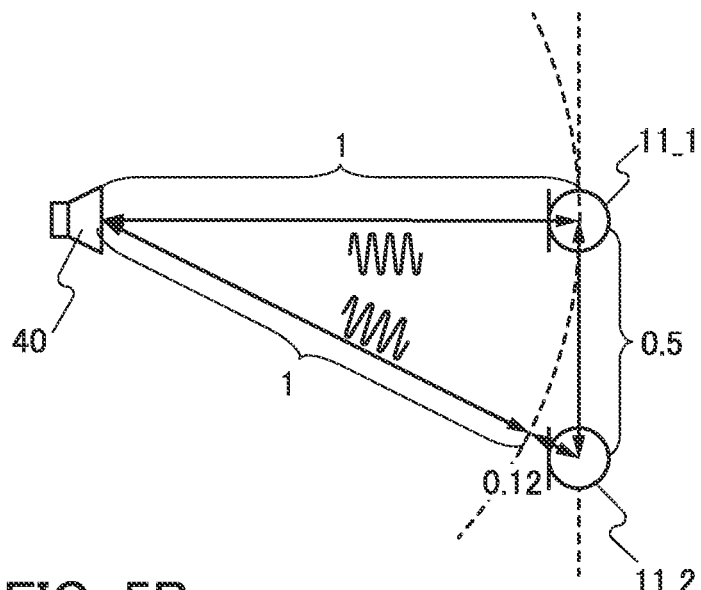
FIG. 5A and FIG. 5B are diagrams showing operations of a semiconductor device.

FIG. 5A is a schematic diagram showing the above-described sound-source-estimation technique, which is done by changing delay time to make the output signals corresponding to the sound signals be in phase.

FIG. 5A shows microphones 11_1 and 11_2 as a part of a microphone array as well as a sound source 40. The distance between the sound source 40 and the microphone 11_1 is 1 m and the distance between the microphone 11_1 and the microphone 11_2 is 0.5 m in FIG. 5A for explanation. The distance between the sound source 40 to the microphone 11_2 is approximately 1.12 m. Thus, the sound which reaches the microphone 11_2 from the sound source 40 delays by 0.35 ms compared to the sound which reaches the microphone 11_1 from the sound source 40 assuming that the speed of sound is 340 m/s.

Figure 5B:
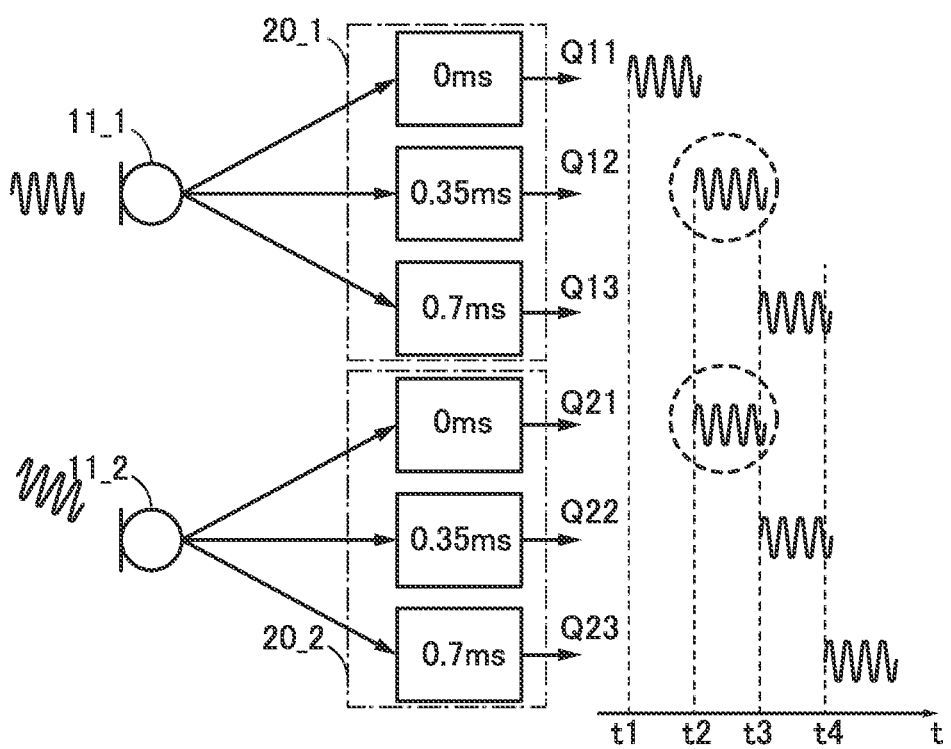

FIG. 5B shows the output signals Q11 to Q13, which are delayed sound signals obtained through the delay circuit 20_1, and the output signals Q21 to Q23, which are delayed sound signals obtained through the delay circuit 20_2 in the schematic diagram in FIG. 5A. The delay circuits 20_1 and 20_2 delay the output signals; the delay circuits are set to have no delay time (0 ms), a delay time (0.35 ms), and a delay time (0.7 ms) as shown in FIG. 5B.

The microphones 11_1 and 11_2 have different sound-arrival times, and the output signals output from both of the delay circuits 20_1 and 20_2 do not match at a time t1 in no delay time (0 ms) as shown in FIG. 5B. Meanwhile, the output signal output from the delay circuit 20_1 with a delay time (0.35 ms) and the output signal output from the delay circuit 20_2 with no delay time match at a time t2. This also applies to the output signals obtained at times t3 and t4. By comparing the output signals passing through different delay circuits, correspondence or incorrespondence of output-signal phases are determined, which can be used for sound-source estimation.

As shown in schematic diagrams of FIG. 5A and FIG. 5B, the output signals based on the sampled sound signal are delayed and the output signals are compared to each other. The delay time of a phase of sound which comes from the target direction can be estimated; by calculating the difference of the distance to the sound source using the delay time, the sound-source identification device can function for focusing the target direction.

Figure 6:
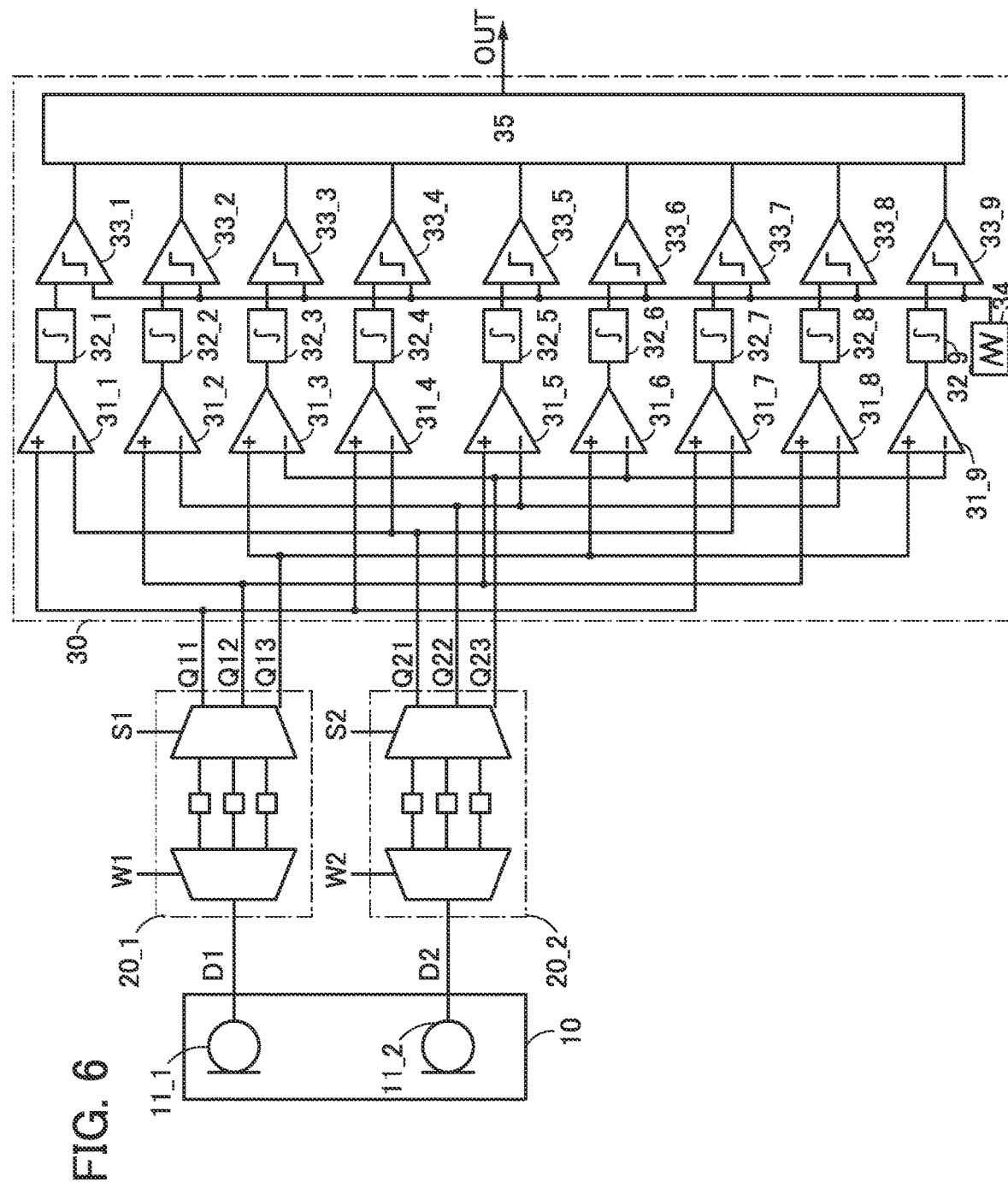
FIG. 6 is a diagram showing an operation of a semiconductor device.

FIG. 6 shows a specific structure example of the signal processing circuit 30. The signal processing circuit 30 in FIG. 6 includes differential circuits 31_1 to 31_9, integrator circuits 32_1 to 32_9, comparators 33_1 to 33_9, a triangle-wave-generator circuit 34, and an arithmetic circuit 35.

The differential circuits 31_1 to 31_9 calculate the difference between the output signals (the output signals Q11 to Q13 and Q21 to Q23 in the FIG. 6 example) from each delay circuit (the delay circuits 20_1 and 20_2 in the FIG. 6 example). The integrator circuits 32_1 to 32_9 receive the output signals from the differential circuits 31_1 to 31_9 respectively, and integrate the output signals. To the comparators 33_1 to 33_9 are input triangle waves from the triangle-wave-generator circuit 34 and the output signals from the integrator circuits 32_1 to 32_9, and the comparators 33_1 to 33_9 compare voltages. The arithmetic circuit 35 receives the output signals from the comparators 33_1 to 33_9 and estimates delay time for making the sound signals be in phase, thereby obtaining an output signal OUT from the delay time, which corresponds to the difference in the distance to the sound source.

Figure 7A:
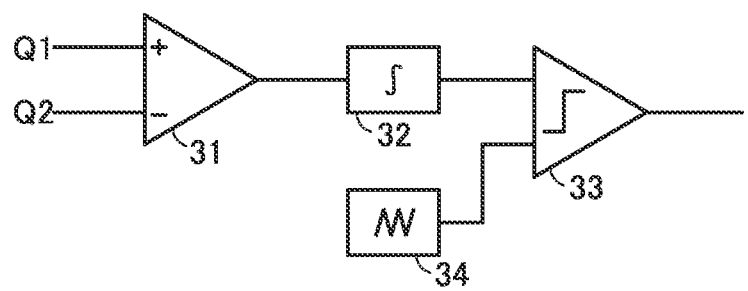
FIG. 7A, FIG. 7B, and FIG. 7C are diagrams showing structures of a semiconductor device.

Specific examples of the circuit included in the signal processing circuit 30 are described with reference to FIG. 7A to FIG. 7C. FIG. 7A is a block diagram showing a structure of one stage in the signal processing circuit 30 in FIG. 6. FIG. 7A shows a differential circuit 31, to which the output signals Q1 and Q2 are input, an integrator circuit 32, a comparator 33, and a triangle-wave-generator circuit 34 as an example.

Figure 7B:
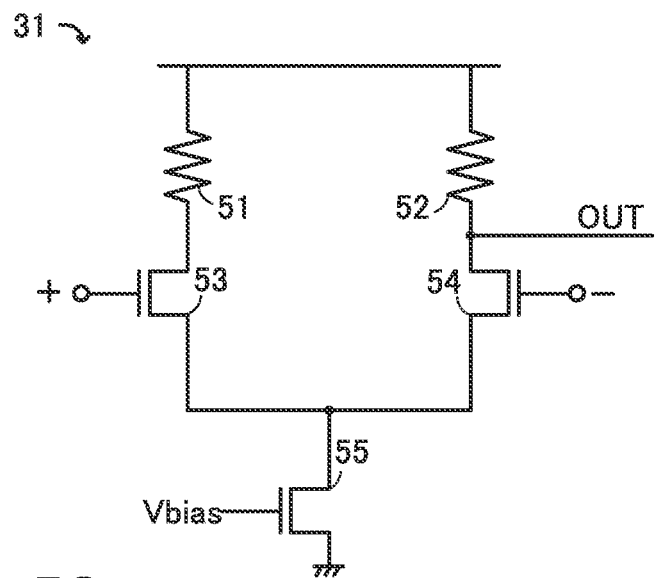

A structure example of the differential circuit 31 is shown in FIG. 7B. The differential circuit 31 includes resistors 51 and 52, and transistors 53, 54, and 55, for example. To a gate of the transistor 53 is connected a non-inverting input terminal. To a gate of the transistor 54 is connected an inverting input terminal. To a gate of the transistor 55 is connected a wiring which provides a bias voltage Vbias. On the drain terminal side of the transistor 54 is provided an output terminal OUT of the differential circuit 31.

Figure 7C:
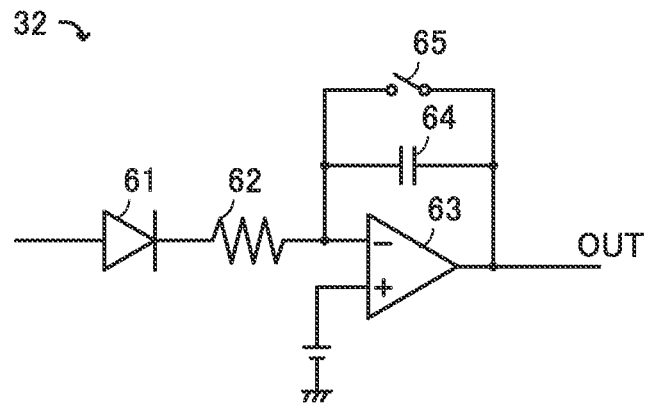

A structure example of the integrator circuit 32 is shown in FIG. 7C. The integrator circuit 32 includes a diode 61, a resistor 62, an operational amplifier 63, a capacitor 64, and a switch 65, for example. To the input terminal of the diode 61 is given the output signal of the differential circuit 31. To the output terminal of the operational amplifier is provided the output terminal OUT of the integrator circuit 32.

Figure 8A:
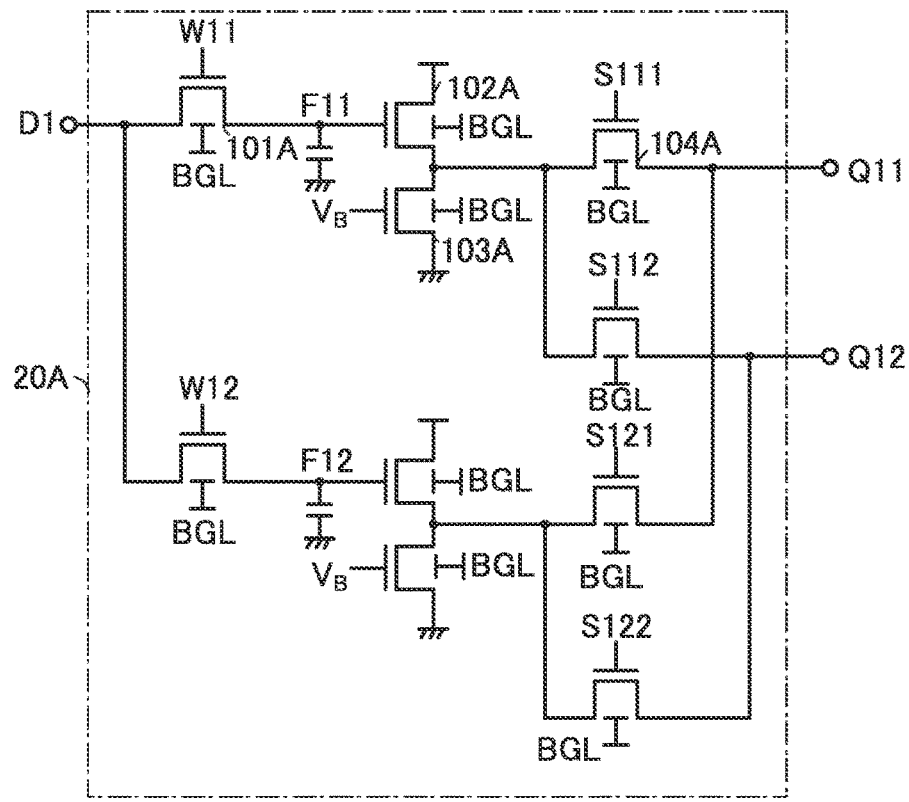
FIG. 8A and FIG. 8B are diagrams showing structures of a semiconductor device.
Figure 8B:
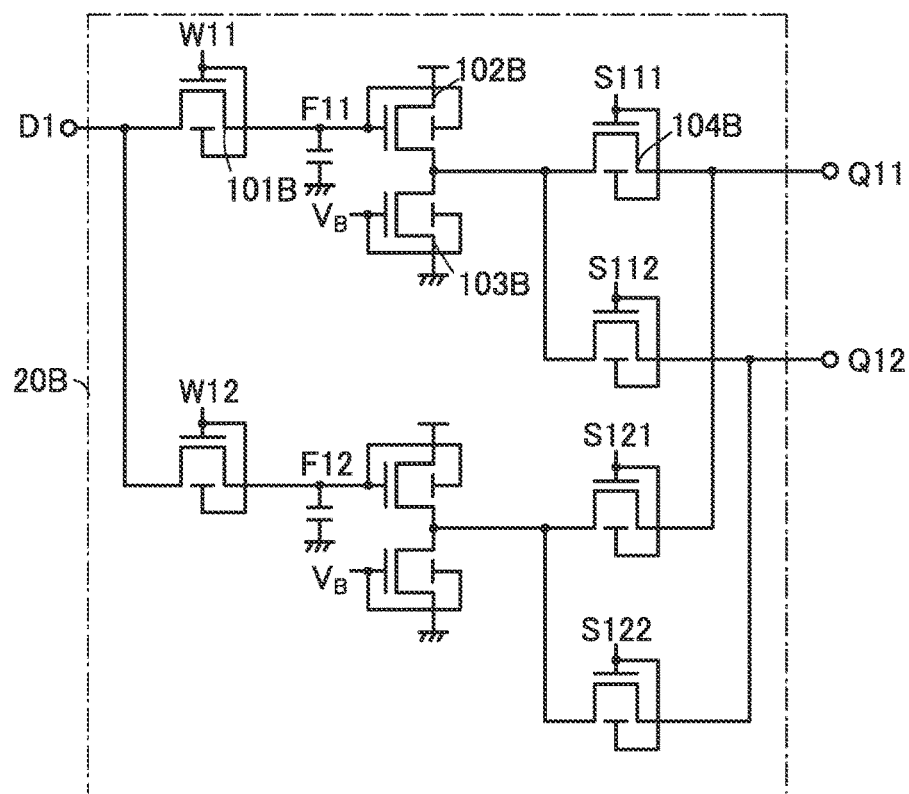

FIG. 8A and FIG. 8B show variation examples of circuit structures, which can be used for each transistor in the above-described delay circuit 20.

The transistors 101 to 104 in FIG. 1B, FIG. 2A, and the like are shown to have a top-gate structure or a bottom-gate structure without a back gate electrode; however they are not limited thereto. For example, transistors 101A to 104A, which have a back gate electrode, may be employed like in a delay circuit 20A in FIG. 8A. The structure in FIG. 8A improves controllability to the transistors 101A to 104A from the outside.

The transistors 101 to 104 in FIG. 1B, FIG. 2A, and the like are shown to have a top-gate structure or a bottom-gate structure without a back gate electrode; however they are not limited thereto. For example, transistors 101B to 104B, which have a back gate electrode connected to a gate electrode, may be employed like in a delay circuit 20B in FIG. 8B. The structure in FIG. 8B can increase the amount of current flowing through the transistors 101B to 104B.

Figure 9A:
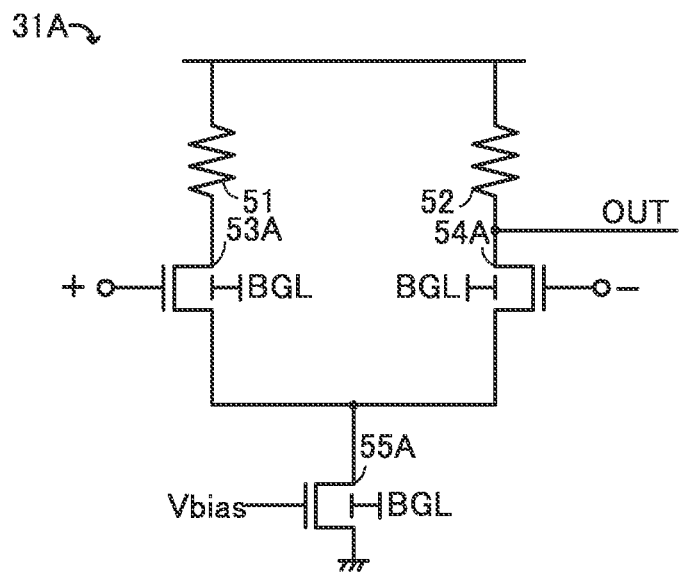
FIG. 9A and FIG. 9B are diagrams showing structures of a semiconductor device.
Figure 9B:
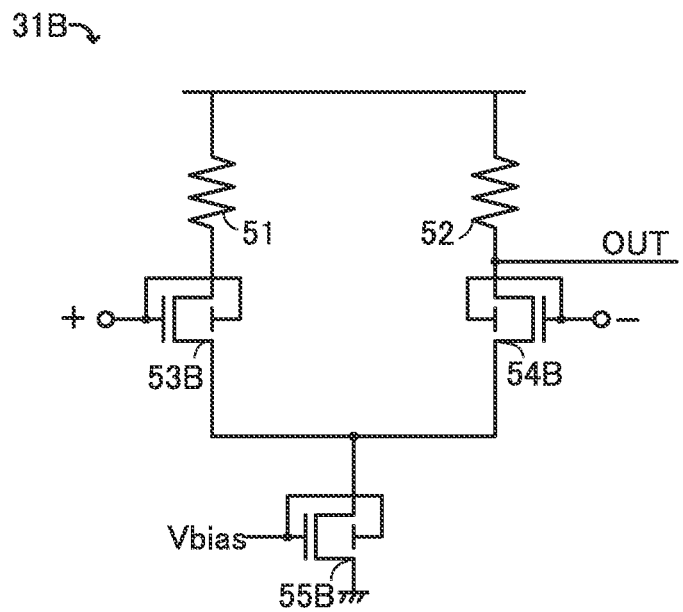

FIG. 9A and FIG. 9B show variation examples of circuit structures which can be used for each transistor in the above-described differential circuit 31.

The transistors 53 to 55 in FIG. 7B are shown to have a top-gate structure or a bottom gate structure without a back gate electrode; however they are not limited thereto. For example, transistors 53A to 55A, which have a back gate electrode, may be employed like in a differential circuit 31A in FIG. 9A. The structure in FIG. 9A improves controllability to the transistors 53A to 555A from the outside.

The transistors 53 to 55 in FIG. 7B are shown to have a top-gate structure or a bottom gate structure without a back gate electrode; however they are not limited thereto. For example, transistors 53B to 55B, which have a back gate electrode connected to a gate electrode, may be employed like in the differential circuit 31B in FIG. 9B. The structure in FIG. 9B can increase the amount of current flowing through the transistors 53B to 55B.

The above-described semiconductor device of one embodiment of the present invention can collectively retain the signals from a plurality of microphones as the analog value and can output delayed signals. The semiconductor device can process signals with analog voltages, which can remove the A/D converter circuit; the structure can reduce malfunctions due to frequency differences and unsynchronization, which are caused by vast amount of arithmetic processing. The semiconductor device of one embodiment of the present invention can be used not only for the sound-source identification technique, which identifies the direction where a specific sound comes, but also for a technique for estimating the state by using phase differences of received signals.

Embodiment 2

In this embodiment is explained a transistor structure which can be used for the structure of the semiconductor device in the above-described embodiment; specifically, a structure in which transistors with different electrical properties are stacked. In this embodiment, in particular, a structure example of transistors included in delay circuits of the semiconductor device is shown. With such a structure, the degree of freedom in design of the semiconductor device can be increased. Stacking transistors having different electrical properties can increase the integration degree of the semiconductor device.

Figure 10:
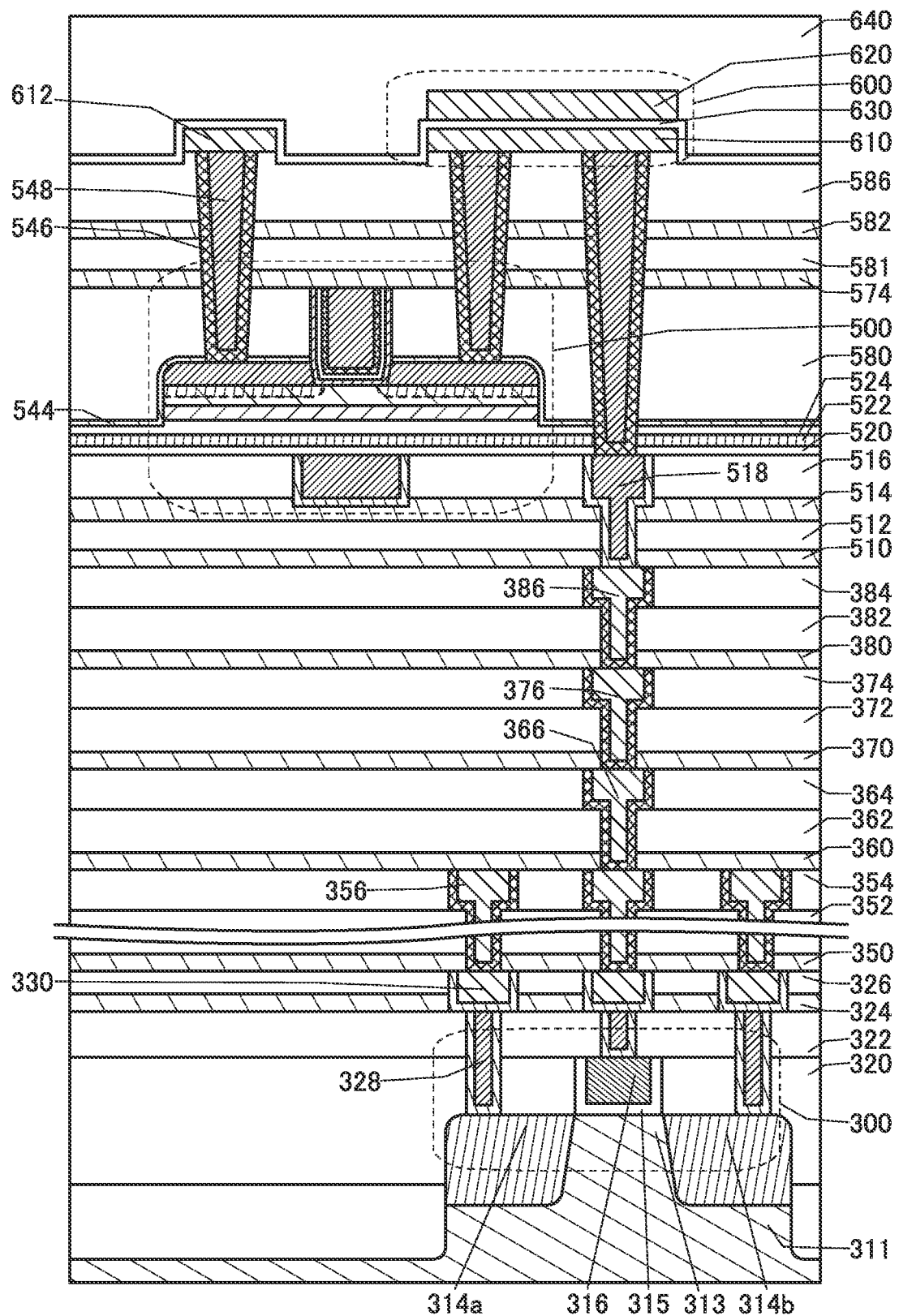
FIG. 10 is a cross-sectional view showing a structure example of a semiconductor device.
Figure 12A:
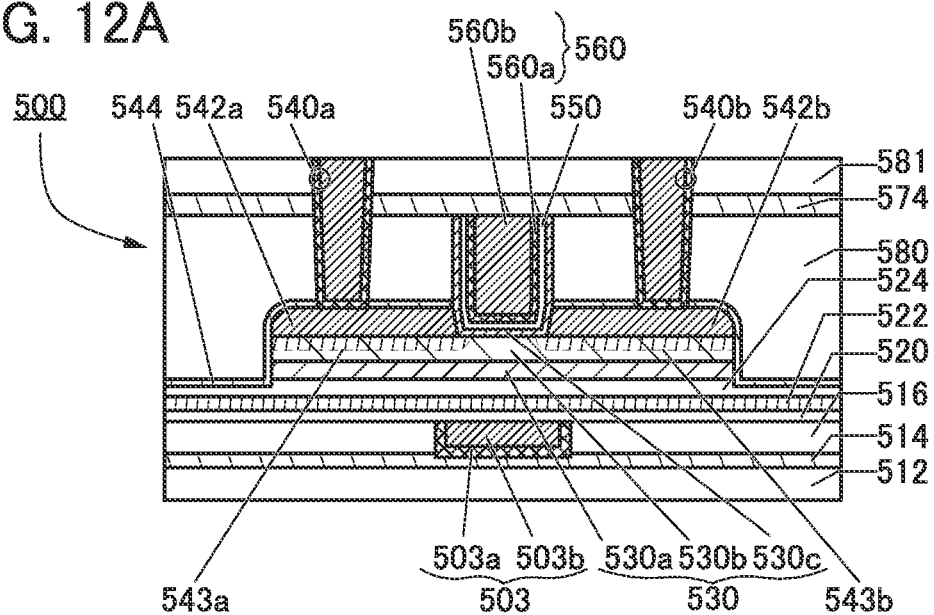
FIG. 12A, FIG. 12B, and FIG. 12C are a top view and cross-sectional views showing a structure example of a transistor.
Figure 12B:
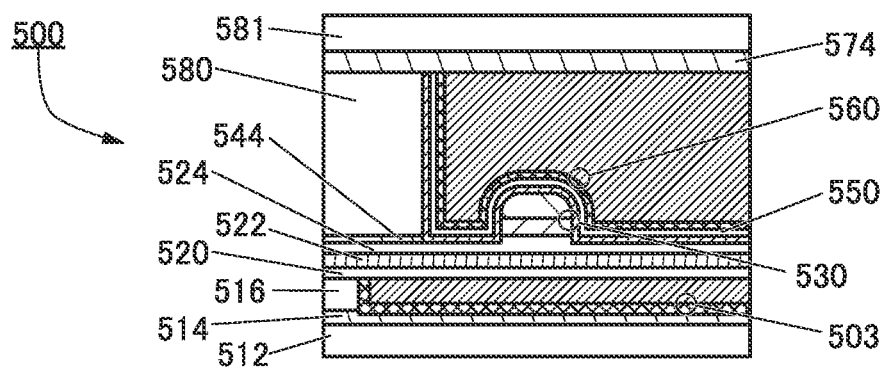
Figure 12C:
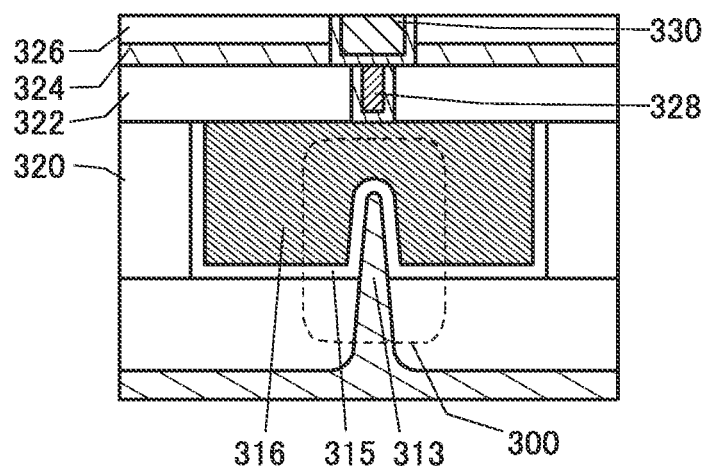

The semiconductor device shown in FIG. 10 includes a transistor 300, a transistor 500, and a capacitor 600. FIG. 12A is a cross-sectional view of the transistor 500 in the channel length direction, FIG. 12B is a cross-sectional view of the transistor 500 in the channel width direction, and FIG. 12C is a cross-sectional view of the transistor 300 in the channel width direction.

The transistor 500 is a transistor including a metal oxide in its channel formation region (an OS transistor). Since the off-state current of the transistor 500 is low, the use of the transistor 500 as an OS transistor included in a semiconductor device enables long-term retention of written data voltage or charges. In other words, power consumption of the semiconductor device can be reduced because the semiconductor device has a low frequency of refresh operation or requires no refresh operation.

The semiconductor device described in this embodiment includes the transistor 300, the transistor 500, and the capacitor 600 as shown in FIG. 10. The transistor 500 is provided above the transistor 300, and the capacitor 600 is provided above the transistor 300 and the transistor 500. The capacitor Cs in a memory circuit MC can be used as the capacitor 600.

The transistor 300 is provided on a substrate 311 and includes a conductor 316, an insulator 315, a semiconductor region 313, which is a part of the substrate 311, and a low-resistance region 314a and a low-resistance region 314b functioning as a source region and a drain region. Note that the transistor 300 can be used, for example, as the transistor included in the buffer circuit 17 in the above embodiment.

In the transistor 300, the top surface and the side surface in the channel width direction of the semiconductor region 313 are covered with the conductor 316 with the insulator 315 therebetween, as shown in FIG. 12C. Such a Fin-type transistor 300 can have an increased effective channel width, and thus have improved on-state characteristics. In addition, contribution of electric fields of the gate electrode can be increased, so that the off-state characteristics of the transistor 300 can be improved.

Note that the transistor 300 can be a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or a conductive material such as a metal material, an alloy material, or a metal oxide material.

Note that the work function depends on a material used for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 11:
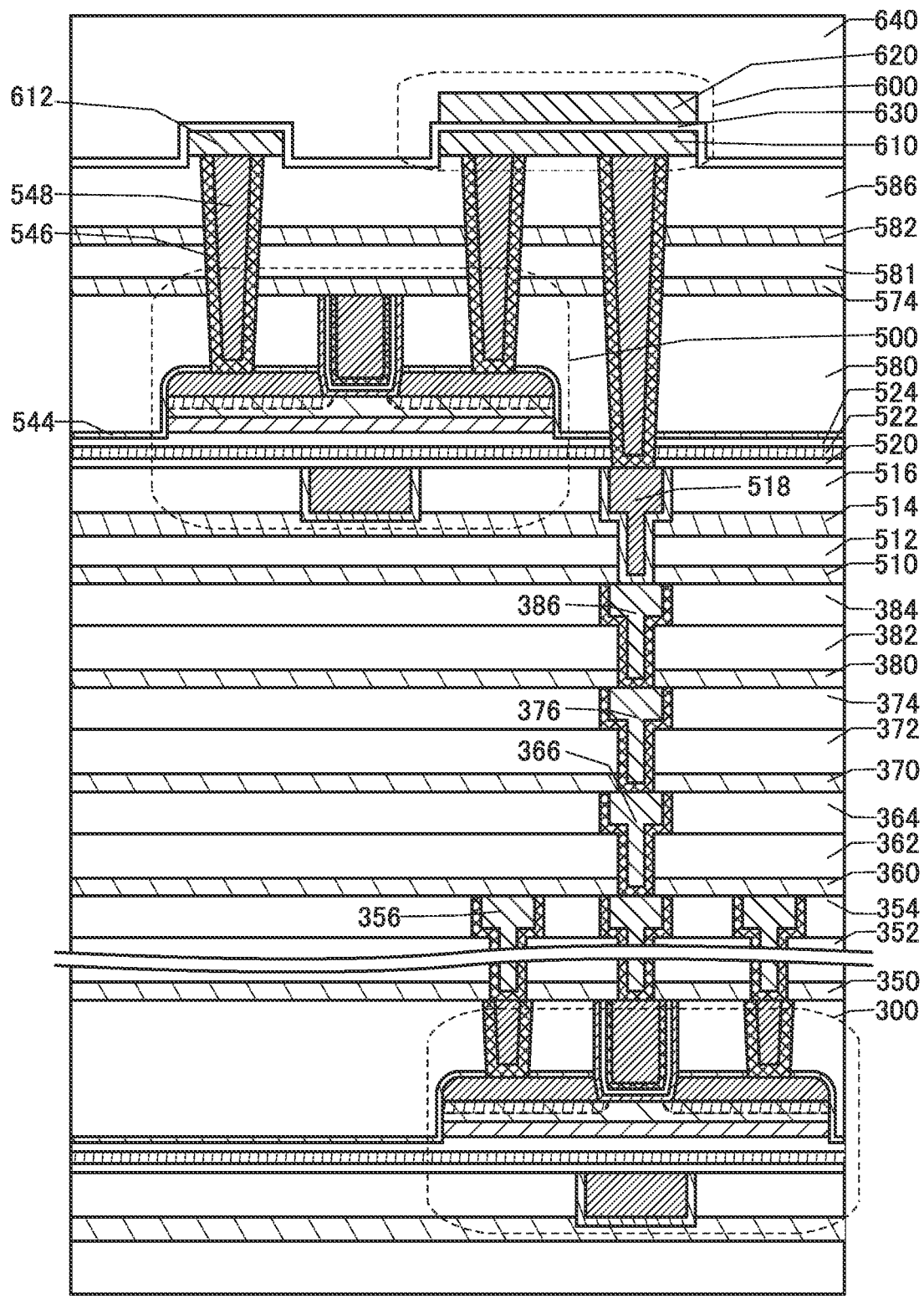
FIG. 11 is a cross-sectional view showing a structure example of a semiconductor device.

The transistor 300 shown in FIG. 10 is just an example and the structure is not limited thereto; an appropriate transistor can be used in accordance with a circuit structure or a driving method. In the case where all the transistors included in the semiconductor device are the OS transistors and have the same conductivity, which means the same-polarity transistors such as n-channel transistors only, for example, the transistor 300 has a structure similar to that of the transistor 500 including an oxide semiconductor as shown in FIG. 11. Note that the details of the transistor 500 are described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 300 or the like provided under the insulator 322. For example, a top surface of the insulator 322 may be planarized by planarization treatment using a chemical mechanical polishing (CMP) method or the like to improve planarity.

The insulator 324 is preferably formed using a film having a barrier property that prevents hydrogen or impurities from the substrate 311, the transistor 300, or the like from diffusing to a region where the transistor 500 is provided.

For the film having a barrier property against hydrogen, silicon nitride formed by a CVD method can be used, for example. The diffusion of hydrogen to a semiconductor element including an oxide semiconductor, such as the transistor 500, may result in degradation of the characteristics of the semiconductor element. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less that of the insulator 324. When a material having a low dielectric constant is used for an interlayer film, parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Furthermore, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 10, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 300. Note that the conductor 356 can be formed using a material similar to those for the conductor 328 and the conductor 330.

For example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. With this structure, the transistor 300 and the transistor 500 can be separated by the barrier layer, so that the diffusion of hydrogen from the transistor 300 to the transistor 500 can be inhibited.

Note that as the conductor having a barrier property against hydrogen, tantalum nitride can be used, for example. Stacking tantalum nitride and tungsten having high conductivity can inhibit the diffusion of hydrogen from the transistor 300 while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 10, an insulator 360, an insulator 362, and an insulator 364 are stacked in this order. Moreover, a conductor 366 is formed in the insulator 360, the insulator 362, and the insulator 364. The conductor 366 has a function of a plug or a wiring. Note that the conductor 366 can be formed using a material similar to those for the conductor 328 and the conductor 330.

For example, the insulator 360 is preferably formed using an insulator having a barrier property against hydrogen, like the insulator 324. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 and the transistor 500 can be separated by the barrier layer, so that the diffusion of hydrogen from the transistor 300 to the transistor 500 can be inhibited.

A wiring layer may be provided over the insulator 364 and the conductor 366. For example, in FIG. 10, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be formed using a material similar to those for the conductor 328 and the conductor 330.

For example, the insulator 370 is preferably formed using an insulator having a barrier property against hydrogen, like the insulator 324. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 and the transistor 500 can be separated by the barrier layer, so that the diffusion of hydrogen from the transistor 300 to the transistor 500 can be inhibited.

A wiring layer may be provided over the insulator 374 and the conductor 376. For example, in FIG. 10, an insulator 380, an insulator 382, and an insulator 384 are stacked in this order. Moreover, a conductor 386 is formed in the insulator 380, the insulator 382, and the insulator 384. The conductor 386 has a function of a plug or a wiring. Note that the conductor 386 can be formed using a material similar to those for the conductor 328 and the conductor 330.

For example, the insulator 380 is preferably formed using an insulator having a barrier property against hydrogen, like the insulator 324. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 and the transistor 500 can be separated by the barrier layer, so that the diffusion of hydrogen from the transistor 300 to the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. The number of wiring layers similar to the wiring layer including the conductor 356 may be three or less, and the number of wiring layers similar to the wiring layer including the conductor 356 may be five or more.

An insulator 510, an insulator 512, an insulator 514, and an insulator 516 are stacked in this order over the insulator 384. A material with a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents hydrogen or impurities from the substrate 311, a region where the transistor 300 is provided, or the like from diffusing to a region where the transistor 500 is provided. Therefore, a material similar to that for the insulator 324 can be used.

For the film having a barrier property against hydrogen, silicon nitride formed by a CVD method can be used, for example. The diffusion of hydrogen to a semiconductor element including an oxide semiconductor, such as the transistor 500, may result in degradation of the characteristics of the semiconductor element. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. The use of a material with a relatively low permittivity for these insulators can reduce the parasitic capacitance between wirings. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be formed using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 to the transistor 500 can be inhibited.

The transistor 500 is provided over the insulator 516.

As shown in FIG. 12A and FIG. 12B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and has an opening between the conductor 542a and the conductor 542b, an oxide 530c positioned on a bottom surface and a side surface of the opening, an insulator 550 positioned on the formation surface of the oxide 530c, and a conductor 560 positioned on the formation surface of the insulator 550.

As shown in FIG. 12A and FIG. 12B, an insulator 544 is preferably provided between the insulator 580 and the oxide 530a, the oxide 530b, the conductor 542a, and the conductor 542b. As shown in FIG. 12A and FIG. 12B, the conductor 560 preferably includes a conductor 560a provided on the inner side of the insulator 550 and a conductor 560b provided to be embedded on the inner side of the conductor 560a. As shown in FIG. 12A and FIG. 12B, an insulator 574 is preferably provided over the insulator 580, the conductor 560, and the insulator 550.

Hereinafter, the oxide 530a, the oxide 530b, and the oxide 530c may be collectively referred to as an oxide 530.

The transistor 500 has a structure where the three layers of the oxide 530a, the oxide 530b, and the oxide 530c are stacked in the region where the channel is formed and its vicinity; however, the present invention is not limited to this. For example, the transistor may have a single-layer structure of the oxide 530b, a two-layer structure of the oxide 530b and the oxide 530a, a two-layer structure of the oxide 530b and the oxide 530c, or a stacked-layer structure of four or more layers. Although the conductor 560 is shown to have a two-layer structure in the transistor 500, the present invention is not limited to this. For example, the conductor 560 may have a single-layer structure or a stacked-layer structure of three or more layers. The transistor 500 shown in FIG. 10 and FIG. 12A is just an example and is not limited to the structure shown therein; an appropriate transistor can be used in accordance with a circuit structure or a driving method.

Here, the conductor 560 functions as a gate electrode of the transistor, and the conductor 542a and the conductor 542b function as a source electrode and a drain electrode. As described above, the conductor 560 is embedded in an opening of the insulator 580 and the region between the conductor 542a and the conductor 542b. The positions of the conductor 560, the conductor 542a, and the conductor 542b are selected in a self-aligned manner with respect to the opening in the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

Since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance formed between the conductor 560 and the conductors 542a and 542b can be reduced. As a result, the transistor 500 can have increased switching speed and excellent frequency characteristics.

The conductor 560 functions as a first gate (also referred to as top gate) electrode in some cases. The conductor 503 functions as a second gate (also referred to as bottom gate) electrode in some cases. In that case, the threshold voltage of the transistor 500 can be controlled by changing a potential applied to the conductor 503 independently of a potential applied to the conductor 560. In particular, when a negative potential is applied to the conductor 503, the threshold voltage of the transistor 500 can be higher than 0 V, and the off-state current can be reduced. Thus, a drain current at the time when a potential applied to the conductor 560 is 0 V can be smaller in the case where a negative potential is applied to the conductor 503 than in the case where a negative potential is not applied to the conductor 503.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; the conductor 503a is formed in contact with an inner wall of an opening in the insulator 514 and the insulator 516, and the conductor 503b is formed further inside. Although the transistor 500 in which the conductor 503a and the conductor 503b are stacked is illustrated, the present invention is not limited thereto. For example, the conductor 503 may have a single-layer structure or a stacked-layer structure of three or more layers.

The conductor 503a is preferably formed using a conductive material having a function of inhibiting diffusion of impurities such as a hydrogen atom, a hydrogen molecule, a water molecule, and a copper atom (a conductive material through which the above impurities are less likely to pass). Alternatively, the conductor 503a is preferably formed using a conductive material having a function of inhibiting diffusion of oxygen (e.g., at least one of oxygen atoms, oxygen molecules, and the like) (a conductive material through which the above oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

When the conductor 503 also functions as a wiring, the conductor 503b is preferably formed using a conductive material that has high conductivity and contains tungsten, copper, or aluminum as its main component. In that case, a conductor 505 does not always need to be provided. Note that the conductor 503b is a single layer in the diagram but may have a stacked-layer structure, for example, a stacked-layer structure of titanium or titanium nitride and any of the above conductive materials.

The insulator 520, the insulator 522, the insulator 524, and the insulator 550 have a function of a second gate insulating film.

Here, as the insulator 524 in contact with the oxide 530, an insulator containing more oxygen than that in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced, and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or within the range of 100° C. to 400° C.

When the insulator 524 includes an excess-oxygen region, the insulator 522 preferably has a function of inhibiting diffusion of oxygen (e.g., oxygen atoms and oxygen molecules) (or that the insulator 522 be less likely to transmit the above oxygen).

The insulator 522 preferably has a function of inhibiting diffusion of oxygen or impurities, in which case diffusion of oxygen contained in the oxide 530 to the insulator 520 side is prevented. Furthermore, the conductor 503 can be prevented from reacting with oxygen in the insulator 524 or the oxide 530.

The insulator 522 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST). As miniaturization and high integration of transistors progress, a problem such as generation of leakage current may arise because of a thinner gate insulating film. When a high-k material is used for an insulator functioning as the gate insulating film, a gate potential at the time when the transistor operates can be reduced while the physical thickness of the gate insulating film is maintained.

It is particularly preferable to use an insulator containing an oxide of one or both of aluminum and hafnium, which is an insulating material having a function of inhibiting diffusion of impurities, oxygen, and the like (i.e., an insulating material through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are suitable. Furthermore, a combination of a high-k insulator and silicon oxide or silicon oxynitride enables the insulators 520 and 526 to have a stacked-layer structure that is thermally stable and has a high dielectric constant.

Note that the transistor 500 in FIG. 12A and FIG. 12B includes the insulator 520, the insulator 522, and the insulator 524 as the second gate insulating film having a three-layer structure; however, the second gate insulating film may have a single-layer structure, a two-layer structure, or a stacked-layer structure of four or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In—M—Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. The In—M—Zn oxide that can be used as the oxide 530 is particularly preferably a CAAC-OS or a CAC-OS. Alternatively, an In—Ga oxide or an In—Zn oxide may be used as the oxide 530.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

By including the oxide 530a under the oxide 530b, the oxide 530 can inhibit diffusion of impurities into the oxide 530b from the components formed below the oxide 530a. By including the oxide 530c over the oxide 530b, the oxide 530 can inhibit diffusion of impurities into the oxide 530b from the components formed above the oxide 530c.

The oxide 530 preferably has a stacked-layer structure of oxides that differ in the atomic ratio of metal atoms. Specifically, the atomic proportion of the element M to the constituent elements in the metal oxide used as the oxide 530a is preferably greater than that in the metal oxide used as the oxide 530b. Moreover, the atomic ratio of the element M to In in the metal oxide used as the oxide 530a is preferably greater than that in the metal oxide used as the oxide 530b. Furthermore, the atomic ratio of In to the element M in the metal oxide used as the oxide 530b is preferably greater than that in the metal oxide used as the oxide 530a. The oxide 530c can be formed using a metal oxide that can be used as the oxide 530a or the oxide 530b.

The energy of the conduction band minimum of the oxide 530a and the oxide 530c is preferably higher than that of the oxide 530b. In other words, the electron affinity of the oxide 530a and the oxide 530c is preferably smaller than that of the oxide 530b.

Here, the energy level of the conduction band minimum is gradually varied at junction portions of the oxide 530a, the oxide 530b, and the oxide 530c. In other words, the energy level of the conduction band minimum at the junction portions of the oxide 530a, the oxide 530b, and the oxide 530c is continuously varied or continuously connected. To vary the energy level gradually, the density of defect states in a mixed layer formed at the interface between the oxide 530a and the oxide 530b and the interface between the oxide 530b and the oxide 530c is decreased.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film such as a tantalum nitride film is preferable because it has a barrier property against hydrogen or oxygen.

Although the conductor 542a and the conductor 542b each having a single-layer structure are illustrated in FIG. 12A, a stacked-layer structure of two or more layers may be employed. For example, a tantalum nitride film and a tungsten film may be stacked. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

As shown in FIG. 12A, a region 543a and a region 543b are sometimes formed as low-resistance regions in the oxide 530 at and around the interface with the conductor 542a (the conductor 542b). In this case, the region 543a functions as one of a source region and a drain region, and the region 543b functions as the other of the source region and the drain region. The channel formation region is formed in a region between the region 543a and the region 543b.

When the conductor 542a (the conductor 542b) is provided in contact with the oxide 530, the oxygen concentration of the region 543a (the region 543b) sometimes decreases. In addition, a metal compound layer that contains a metal contained in the conductor 542a (the conductor 542b) and a component of the oxide 530 is sometimes formed in the region 543a (the region 543b). In such cases, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. Here, the insulator 544 may be provided to cover the side surface of the oxide 530 and to be in contact with the insulator 524.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. In addition, silicon nitride oxide or silicon nitride can also be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are an oxidation-resistant material or do not significantly lose the conductivity even after absorbing oxygen. Design is appropriately determined in consideration of required transistor characteristics.

The insulator 544 can inhibit impurities such as water and hydrogen contained in the insulator 580 from diffusing into the oxide 530b through the oxide 530c and the insulator 550. The insulator 544 can also inhibit oxidation of the conductor 560 due to excess oxygen contained in the insulator 580.

The insulator 550 functions as a first gate insulating film. The insulator 550 is preferably in contact with the inner side (the top surface and the side surface) of the oxide 530c. Like the insulator 524 described above, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

In order to efficiently supply excess oxygen of the insulator 550 to the oxide 530, a metal oxide may be provided between the insulator 550 and the conductor 560. The metal oxide preferably inhibits oxygen diffusion from the insulator 550 to the conductor 560. Providing the metal oxide that inhibits oxygen diffusion suppresses diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be suppressed. For the metal oxide, a material that can be used for the insulator 544 is used.

Note that the insulator 550 may have a stacked-layer structure like the second gate insulating film. With miniaturization and high integration of a transistor, a problem such as generation of leakage current sometimes arises because of a thin gate insulating film. Thus, when an insulator functioning as a gate insulating film has a stacked-layer structure of a high-k material and a thermally stable material, a gate potential at the time of operating the transistor can be reduced while the physical thickness of the gate insulating film is kept. Furthermore, the stacked-layer structure can be thermally stable and have a high dielectric constant.

Although the conductor 560 functioning as the first gate electrode has a two-layer structure in FIGS. 12A and 12B, the conductor 560 may have a single-layer structure or a stacked-layer structure of three or more layers.

The conductor 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 560a is preferably formed using a conductive material having a function of inhibiting diffusion of oxygen (e.g., at least one of oxygen atoms, oxygen molecules, and the like). When the conductor 560a has a function of inhibiting diffusion of oxygen, it is possible to inhibit a reduction in conductivity of the conductor 560b due to oxidation of the conductor 560b caused by oxygen in the insulator 550. As a conductive material having a function of inhibiting oxygen diffusion, tantalum, tantalum nitride, ruthenium, or ruthenium oxide is preferably used, for example. An oxide semiconductor that can be used for the oxide 530 can be used as the conductor 560a. In that case, when the conductor 560b is formed by a sputtering method, the conductor 560a can have a reduced electric resistance and become a conductor. Such a conductor can be referred to as an OC (Oxide Conductor) electrode.

The conductor 560b is preferably formed using a conductive material containing tungsten, copper, or aluminum as its main component. The conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of titanium or titanium nitride and any of the above conductive materials.

The insulator 580 is provided over the conductor 542a and the conductor 542b with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride are particularly preferable in terms of high thermal stability. In particular, silicon oxide and porous silicon oxide, in which an excess-oxygen region can be easily formed in a later step, are preferable.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. The concentration of impurities such as water or hydrogen in the insulator 580 is preferably lowered.

The opening in the insulator 580 overlaps with the region between the conductor 542a and the conductor 542b. Accordingly, the conductor 560 is embedded in the opening of the insulator 580 and the region between the conductor 542a and the conductor 542b.

For miniaturization of the semiconductor device, the gate length needs to be short, but it is necessary to prevent a reduction in conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is provided to be embedded in the opening of the insulator 580 in this embodiment.

The insulator 574 is preferably provided in contact with the top surface of the insulator 580, the top surface of the conductor 560, and the top surface of the insulator 550. When the insulator 574 is formed by a sputtering method, an excess-oxygen region can be provided in the insulator 550 and the insulator 580. Thus, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness within the range of 0.5 nm to 3.0 nm can inhibit diffusion of hydrogen and nitrogen. Accordingly, an aluminum oxide film formed by a sputtering method can serve both as an oxygen supply source and as a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

A conductor 540a and a conductor 540b are provided in openings formed in the insulator 581, the insulator 574, the insulator 580, and the insulator 544. The conductor 540a and the conductor 540b are provided to face each other with the conductor 560 positioned therebetween. The conductor 540a and the conductor 540b each have a structure similar to that of a conductor 546 and a conductor 548 that are described later.

An insulator 582 is provided over the insulator 581. A substance having a barrier property against oxygen and hydrogen is preferably used for the insulator 582. Thus, the insulator 582 can be formed using a material similar to that for the insulator 514. For the insulator 582, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

An insulator 586 is provided over the insulator 582. The insulator 586 can be formed using a material similar to that for the insulator 320. The use of a material with a relatively low permittivity for these insulators can reduce the parasitic capacitance between wirings. For example, a silicon oxide film or a silicon oxynitride film can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have a function of plugs or wirings that are connected to the capacitor 600, the transistor 500, or the transistor 300. The conductor 546 and the conductor 548 can be formed using a material similar to those for the conductor 328 and the conductor 330.

The capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 10; however, the structure is not limited thereto, and a stacked-layer structure of two or more layers may be employed. For example, a conductor having a barrier property and a conductor highly adhesive to a conductor with high conductivity can be formed between a conductor having a barrier property and a conductor having high conductivity.

The conductor 620 is provided so as to overlap with the conductor 610 with the insulator 630 positioned therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 640 is provided over the conductor 620 and the insulator 630. The insulator 640 can be formed using a material similar to that for the insulator 320. The insulator 640 may function as a planarization film that covers an uneven shape thereunder.

Using the structure, a semiconductor device using a transistor including an oxide semiconductor can be miniaturized or highly integrated.

Embodiment 3

In this embodiment, an IC chip, an electronic component, electronic devices, and the like are described as examples of a semiconductor device.

<Fabrication Method Example of Electronic Component>

Figure 13A:
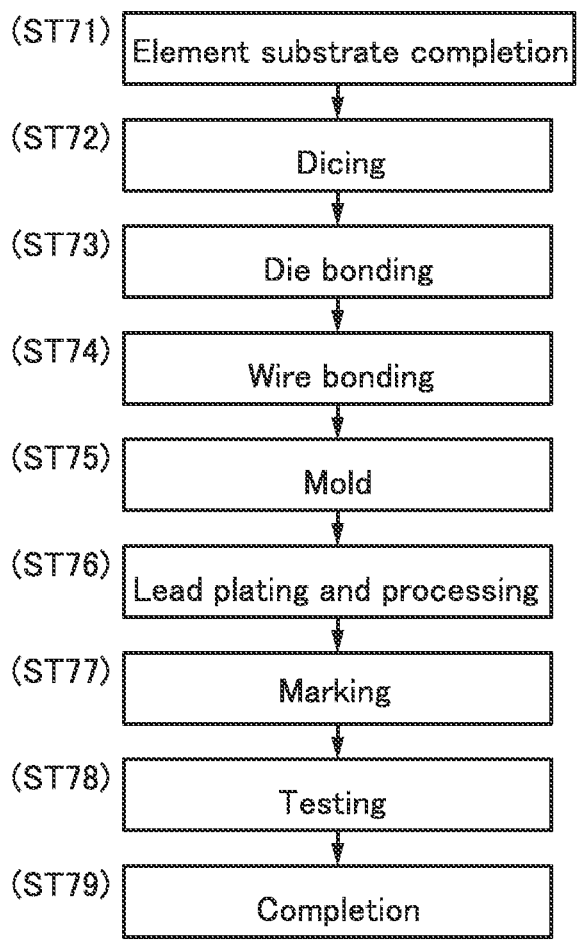
FIG. 13A, FIG. 13B, FIG. 13C, FIG. 13D, and FIG. 13E are diagrams showing structures of a semiconductor wafer and an electronic component.

FIG. 13A is a flow chart showing an example of a method for fabricating an electronic component. The electronic component is also referred to as a semiconductor package or an IC package. The electronic component has a plurality of standards and names corresponding to a terminal extraction direction and a terminal shape. Thus, an example of the electronic component is described in this embodiment. The following electronic component corresponds to the electronic component including the transistors in the delay circuits in the semiconductor device.

A semiconductor device formed with a transistor is completed by integrating detachable components on a printed board through the assembly process (post-process). The post-process can be completed through steps shown in FIG. 13A. Specifically, after an element substrate obtained in the pre-process is completed (Step ST71), a back surface of the substrate is ground. The substrate is thinned in this step to reduce warpage or the like of the substrate in the pre-process and to reduce the size of the component. Then, a dicing step of dividing the substrate into a plurality of chips is performed (Step ST72).

Figure 13B:
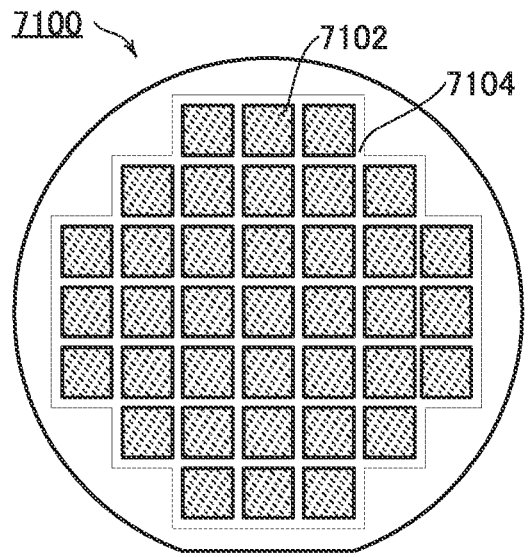
Figure 13C:
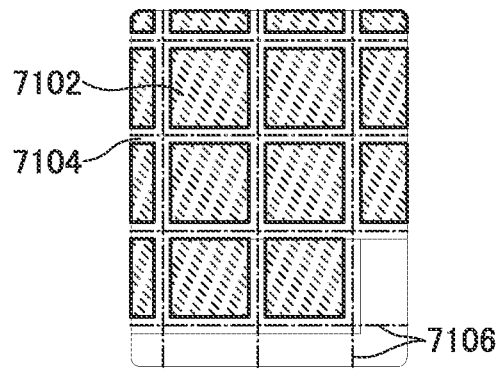

FIG. 13B is a top view of a semiconductor wafer 7100 before a dicing process. FIG. 13C is an enlarged view of part of FIG. 13B. A plurality of circuit regions 7102 are provided on the semiconductor wafer 7100. The semiconductor device of an embodiment of the present invention is provided in the circuit region 7102.

Figure 13D:
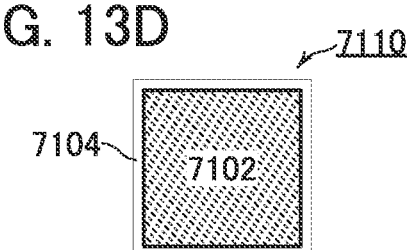

The plurality of circuit regions 7102 are each surrounded by a separation region 7104. Separation lines (also referred to as "dicing lines") 7106 are set at positions overlapping with the separation region 7104. In the dicing step ST72, the semiconductor wafer 7100 is cut along the separation lines 7106, whereby chips 7110 including the circuit regions 7102 are cut out from the semiconductor wafer 7100. FIG. 13D is an enlarged view of the chip 7110.

A conductive layer or a semiconductor layer may be provided in the separation region 7104. Providing a conductive layer or a semiconductor layer in the separation region 7104 relieves ESD that might be caused in the dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation region 7104 allows a reduction in the usage of the pure water. Therefore, the manufacturing cost of semiconductor devices can be reduced. Furthermore, productivity of the semiconductor device can be increased.

After Step ST72, a die bonding step (Step ST73) is performed, where the divided chips are separately picked up, placed on a lead frame, and bonded thereto. As a method for bonding the chip to the lead frame in the die bonding step, a method suitable for the product may be selected. The bonding may be performed, for example, with a resin or a tape. In the die bonding step, the chip may be mounted on an interposer and bonded thereto. In a wire bonding step, a lead of the lead frame and an electrode on the chip are electrically connected to each other with a metal fine line (wire) (Step ST74). A silver line or a gold line can be used as the metal fine line. The wire bonding may be either ball bonding or wedge bonding.

A wire-bonded chip is subjected to a molding step of sealing the chip with an epoxy resin or the like (Step ST75). The molding step is performed, whereby the inside of the electronic component is filled with a resin, so that damage to an embedded circuit portion and wire by external mechanical force can be reduced, and in addition, deterioration of performance due to moisture or dust can be reduced. The lead of the lead frame is plated. After that, the lead is cut and processed (Step ST76). With the plating process, corrosion of the lead can be prevented, and soldering for mounting the electronic component on a printed board in a later step can be performed with higher reliability. A printing process (marking) is performed on a surface of the package (Step ST77). After a testing step (Step ST78), the electronic component is completed (Step ST79).

Figure 13E:
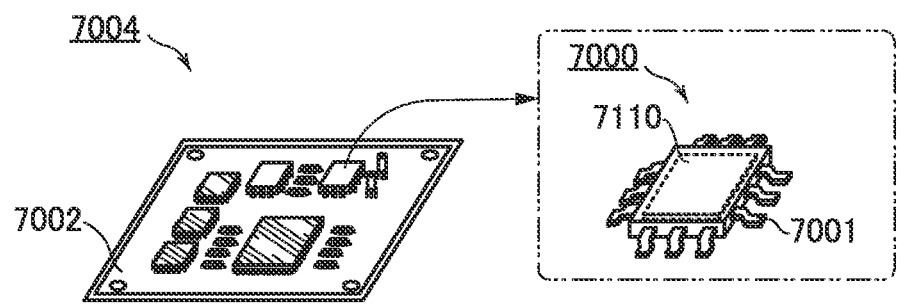

FIG. 13E shows a schematic perspective view of the completed electronic component. FIG. 13E shows a schematic perspective view of a QFP (Quad Flat Package) as an example of the electronic component. As shown in FIG. 13E, an electronic component 7000 includes leads 7001 and a chip 7110.

The electronic component 7000 is mounted on a printed circuit board 7002, for example. A plurality of electronic components 7000 which are combined and electrically connected to each other over the printed board 7002 can be mounted on an electronic device. A completed circuit board 7004 is provided in an electronic device or the like.

The electronic component 7000 can be used as an electronic component (IC chip) of electronic devices in a wide range of fields, such as digital signal processing, software-defined radio systems, avionics (electronic devices related to aviation, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), mobile phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

<Application Examples to Electronic Device>

Next explained are the cases where the above-described electronic component is used for an electronic appliance or a housing such as a television device (TV or television receiver), a vehicle, and a structure body.

Figure 14A:
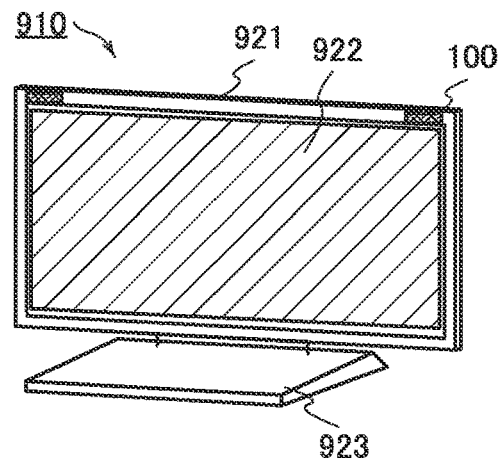
FIG. 14A, FIG. 14B, and FIG. 14C are diagrams showing structure examples of electronic devices.

FIG. 14A shows a television device 910 including a housing 921, a display portion 922, a stand 923, and the like. The semiconductor device 100 shown in the above embodiment is provided in the housing 921.

Figure 14B:
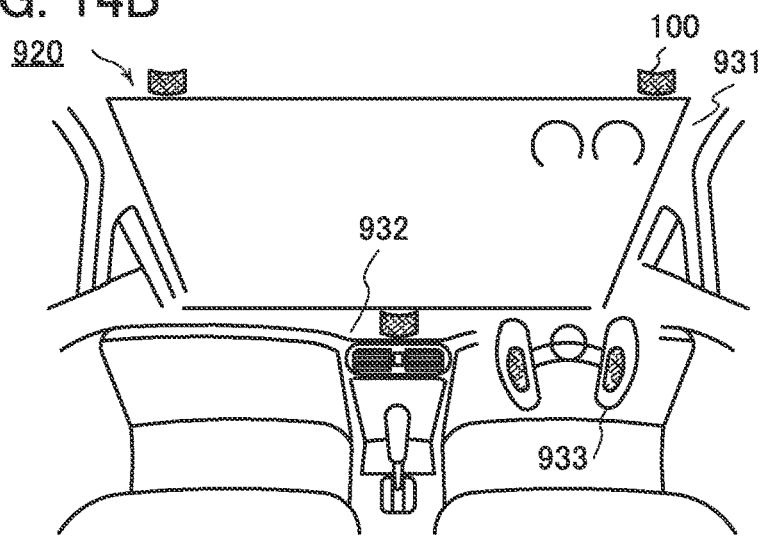

FIG. 14B shows the inner structure of an automobile 920 as an example of a vehicle; a pillar 931, a dashboard 932, a handle 933, and the like are shown as the inner structure of an automobile. The semiconductor device 100 shown in the above-described embodiment can be provided to the pillar 931, the dashboard 932, and the handle 933.

Figure 14C:
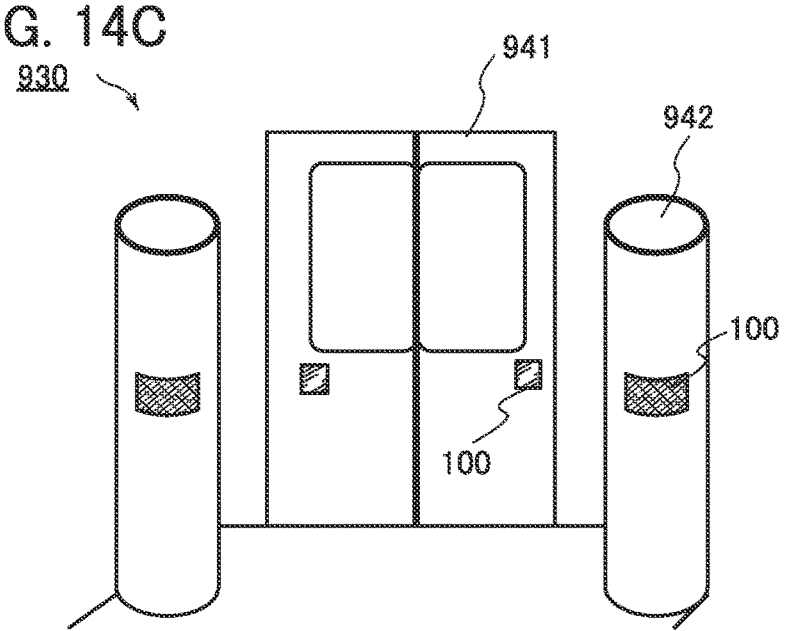

FIG. 14C shows structure bodies such as a door 941 and columns 942. To the door 941 and the columns 942 is provided the semiconductor device 100 shown in the above-described embodiment.

As described above, in the electronic appliances described in this embodiment, the semiconductor device 100 of the above embodiment is provided. Thus, the sound from the user or the like can be identified as a sound source, and an application can be launched based on the identified sound-source location.

<Notes on Description of this Specification and the Like>

The following are notes on the description of the structures in the above embodiments and the embodiments.

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that a content (or part thereof) in an embodiment can be applied to, combined with, or replaced with another content in the same embodiment and/or a content (or part thereof) in another embodiment or other embodiments.

Note that in each embodiment, a content described in the embodiment is a content described with reference to a variety of diagrams or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be created.

In this specification and the like, components are classified on the basis of the functions and shown as blocks independent of each other in block diagrams. However, in an actual circuit or the like, it may be difficult to separate components on the basis of the functions, so that one circuit may be associated with a plurality of functions or several circuits may be associated with one function. Therefore, the segmentation of a block in the block diagrams is not limited by any of the components described in the specification, and can be differently determined as appropriate depending on situations.

In drawings, the size, the layer thickness, or the region is freely determined for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In this specification and the like, the expressions "one of a source and a drain" (or a first electrode or a first terminal) and "the other of the source and the drain" (or a second electrode or a second terminal), which is for the other of the source and the drain, are used to describe the connection relation to a source and a drain of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Moreover, the term "electrode" or "wiring" also includes the case where a plurality of "electrodes" or "wirings" are formed in an integrated manner, for example.

In this specification and the like, voltage and potential can be interchanged with each other as appropriate. The term "voltage" refers to a potential difference from a reference potential. When the reference potential is a ground voltage, for example, "voltage" can be replaced with "potential". The ground potential does not necessarily mean 0 V. Potentials are relative values, and the potential applied to a wiring or the like is changed depending on the reference potential, in some cases.

Note that in this specification and the like, the terms such as "film" and "layer" can be interchanged with each other depending on the case or circumstances. For example, the term "conductive layer" can be changed into the term "conductive film" in some cases. For another example, the term "insulating film" can be changed into the term "insulating layer" in some cases.

In this specification and the like, a switch is in a conduction state (on state) or in a non-conduction state (off state) to determine whether current flows therethrough or not. Alternatively, a switch has a function of selecting and changing a current path.

In this specification and the like, the channel length refers to, for example, the distance between a source and a drain in a region where a semiconductor (or a portion where current flows in a semiconductor when a transistor is on) and a gate overlap each other, or a region where a channel is formed in a top view of the transistor.

In this specification and the like, the channel width refers to, for example, the length of a portion where a source and a drain face each other in a region where a semiconductor (or a portion where current flows in a semiconductor when a transistor is on) and a gate electrode overlap each other, or a region where a channel is formed.

In this specification and the like, the expression "A and B are connected" means the case where A and B are electrically connected as well as the case where A and B are directly connected. Here, the expression "A and B are electrically connected" means the case where electric signals can be transmitted and received between A and B when an object having any electric action exists between A and B.

REFERENCE NUMERALS

D1: sound signal, D2: sound signal, DN: sound signal, F11: node, F12: node, F13: node, F21: node, F22: node, F23: node, O11: node, O13: node, O21: node, O23: node, Q1: output signal, Q1n: output signal, Q11: output signal, Q11-Q1n: output signal, Q12: output signal, Q13: output signal, Q21: output signal, Q21-Q2n: output signal, Q22: output signal, QN1-QNn: output signal, S1n: selection signal, S11: selection signal, S111: selection signal, S211: selection signal, ST72: dicing process, t1: time, t2: time, t3: time, T1: time, T2: time, T4: time, T5: time, T6: time, T7: time, T8: time, W11: selection signal, W12: selection signal, W13: selection signal, W21: selection signal, W23: selection signal, W111: selection signal, W112: selection signal, W121: selection signal, W122: selection signal, W131: selection signal, W132: selection signal, W211: selection signal, W212: selection signal, W221: selection signal, W222: selection signal, W231: selection signal, W232: selection signal, 10: microphone array, 11: microphone, 11_1: microphone, 11_2: microphone, 17: buffer circuit, 20: delay circuit, 20_N: delay circuit, 20_1: delay circuit, 20_2: delay circuit, 20A: delay circuit, 20B: delay circuit, 21: selection circuit, 22: signal retention circuit, 23: selection circuit, 30: signal processing circuit, 31: differential circuit, 31_1: differential circuit, 31_9: differential circuit, 31A: differential circuit, 31B: differential circuit, 32: integrator circuit, 32_1: integrator circuit, 32_9: integrator circuit, 33: comparator, 33_1: comparator, 33_9: comparator, 34: triangle-wave-generator circuit, 35: arithmetic circuit, 40: sound source, 51: resistor, 52: resistor, 53: transistor, 53A: transistor, 53B: transistor, 54: transistor, 55: transistor, 55A: transistor, 55B: transistor, 61: diode, 62: resistor, 63: operational amplifier, 64: capacitor, 65: switch, 100: semiconductor device, 101: transistor, 101A: transistor, 101B: transistor, 102: transistor, 103: transistor, 104: transistor, 104A: transistor, 104B: transistor, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 503: conductor, 503a: conductor, 503b: conductor, 505: conductor, 510: insulator, 512: insulator, 514: insulator, 516: insulator, 518: conductor, 520: insulator, 522: insulator, 524: insulator, 526: insulator, 530: oxide, 530a: oxide, 530b: oxide, 530c: oxide, 540a: conductor, 540b: conductor, 542a: conductor, 542b: conductor, 543a: region, 543b: region, 544: insulator, 546: conductor, 548: conductor, 550: insulator, 555A: transistor, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 640: insulator, 910: television device, 920: automobile, 921: housing, 922: display portion, 923: stand, 931: pillar, 932: dashboard, 933: handle, 941: door, 942: column, 7000: electronic component, 7001: lead, 7002: printed board, 7004: circuit board, 7100: semiconductor wafer, 7102: circuit region, 7104: separation region, 7106: separation line, 7110: chip

The invention claimed is:

1. A semiconductor device comprising:
a first microphone and a second microphone;
a first selection circuit configured to select one of the first microphone and the second microphone and comprising a first transistor;
a first signal retention circuit configured to obtain a plurality of first sound signals from the first microphone at different timings and to retain a plurality of first voltages depending on the plurality of first sound signals and comprising a second transistor;
a second signal retention circuit configured to obtain a plurality of second sound signals from the second microphone at different timings and to retain a plurality of second voltages depending on the plurality of second sound signals;
a second selection circuit configured to select one of the plurality of first voltages and one of the plurality of second voltages and comprising a third transistor; and
a signal processing circuit to which the one of the plurality of first voltages and the one of the plurality of second voltages are input,
wherein the second selection circuit is configured to generate a signal delayed from one of the plurality of first sound signals and the plurality of second sound signals,
wherein the one of the first microphone and the second microphone is electrically connected to one of a source and a drain of the first transistor,
wherein the other of the source and the drain of the first transistor is electrically connected to a gate of the second transistor, and
wherein one of a source and a drain of the second transistor is electrically connected to one of a source and a drain of the third transistor.

2. The semiconductor device according to claim 1,
wherein the signal processing circuit comprises a differential circuit, an integrator circuit, a comparator, and a triangle-wave-generator circuit,
wherein the one of the plurality of first voltages and the one of the plurality of second voltages are input to the differential circuit,
wherein an output signal from the differential circuit is input to the integrator circuit, and
wherein an output signal from the integrator circuit and an output signal from the triangle-wave-generator circuit are input to the comparator.

3. The semiconductor device according to claim 2,
wherein the differential circuit comprises a fourth transistor, and
wherein the fourth transistor comprises a semiconductor layer comprising an oxide semiconductor in a channel formation region.

4. The semiconductor device according to claim 1,
wherein the first selection circuit is a demultiplexer, and
wherein the second selection circuit is a multiplexer.

5. A semiconductor device comprising:
a first microphone and a second microphone;
a first selection circuit configured to select one of the first microphone and the second microphone and comprising a first transistor;

a first signal retention circuit configured to obtain a plurality of first sound signals from the first microphone at different timings and to retain a plurality of first voltages depending on the plurality of first sound signals and comprising a second transistor;

a second signal retention circuit configured to obtain a plurality of second sound signals from the second microphone at different timings and to retain a plurality of second voltages depending on the plurality of second sound signals;

a second selection circuit configured to select one of the plurality of first voltages and one of the plurality of second voltages and comprising a third transistor; and a signal processing circuit to which the one of the plurality of first voltages and the one of the plurality of second voltages are input, wherein the second selection circuit is configured to generate a signal delayed from one of the plurality of first sound signals and the plurality of second sound signals signals, wherein the one of the first microphone and the second microphone is electrically connected to one of a source and a drain of the first transistor, wherein the other of the source and the drain of the first transistor is electrically connected to a gate of the second transistor, wherein one of a source and a drain of the second transistor is electrically connected to one of a source and a drain of the third transistor, and wherein each of the first transistor, the second transistor, and the third transistor comprises a semiconductor layer comprising an oxide semiconductor in a channel formation region.

6. The semiconductor device according to claim 5, wherein the signal processing circuit comprises a differential circuit, an integrator circuit, a comparator, and a triangle-wave-generator circuit, wherein the one of the plurality of first voltages and the one of the plurality of second voltages are input to the differential circuit, wherein an output signal from the differential circuit is input to the integrator circuit, and wherein an output signal from the integrator circuit and an output signal from the triangle-wave-generator circuit are input to the comparator.

7. The semiconductor device according to claim 5, wherein the first selection circuit is a demultiplexer, and wherein the second selection circuit is a multiplexer.

8. The semiconductor device according to claim 6, wherein the differential circuit comprises a fourth transistor, and wherein the fourth transistor comprises a semiconductor layer comprising an oxide semiconductor in a channel formation region.

* * * * *